United States Patent
Kaneko et al.

(10) Patent No.: US 9,241,397 B2
(45) Date of Patent: Jan. 19, 2016

(54) MICROWAVE PLASMA PROCESSING APPARATUS AND MICROWAVE SUPPLY METHOD

(71) Applicant: TOKYO ELECTRON LIMITED, Tokyo (JP)

(72) Inventors: Kazushi Kaneko, Miyagi (JP); Yunosuke Hashimoto, Miyagi (JP); Yohei Ishida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/512,655

(22) Filed: Oct. 13, 2014

(65) Prior Publication Data

US 2015/0108897 A1    Apr. 23, 2015

(30) Foreign Application Priority Data

Oct. 17, 2013  (JP) ................. 2013-216739

(51) Int. Cl.
*H05H 1/46* (2006.01)
*H01J 37/32* (2006.01)

(52) U.S. Cl.
CPC .............. *H05H 1/46* (2013.01); *H01J 37/3222* (2013.01); *H01J 37/3299* (2013.01); *H01J 37/32192* (2013.01); *H01J 37/32229* (2013.01); *H01J 37/32935* (2013.01); *H05H 2001/4607* (2013.01)

(58) Field of Classification Search
CPC ...................................................... H05H 1/46
USPC .................................... 315/111.21, 291, 307
See application file for complete search history.

(56) References Cited

U.S. PATENT DOCUMENTS

2010/0176121 A1*  7/2010  Nobue et al. ................... 219/716
2012/0218799 A1*  8/2012  Furukawa et al. ............ 363/126

FOREIGN PATENT DOCUMENTS

| JP | 3-191074 A | 8/1991 |
|----|------------|--------|
| JP | 9-63793 A | 3/1997 |
| JP | 2007-213994 A | 8/2007 |
| JP | 2011-14542 A | 1/2011 |

* cited by examiner

*Primary Examiner* — Don Le
(74) *Attorney, Agent, or Firm* — Rothwell, Figg, Ernst & Manbeck, P.C.

(57) ABSTRACT

Disclosed is a microwave plasma processing apparatus including: a processing container configured to define a processing space a microwave generator configured to generate microwaves for generating plasma of a processing gas introduced into the processing space, a distributor configured to distribute the microwaves to a plurality of waveguides using a variable distribution ratio, an antenna installed in the processing container to seal the processing space and configured to radiate the microwaves distributed to each of the plurality of waveguides by the distributor to the processing space, a monitor unit configured to monitor a power of the microwaves distributed to each of the plurality of waveguides by the distributor, and a distribution ratio control unit configured to correct the distribution ratio used for distribution of the microwaves by the distributor based on a difference between a ratio of the power of the microwaves monitored by the monitor unit and a previously designated distribution ratio.

7 Claims, 22 Drawing Sheets

MICROWAVE PLASMA PROCESSING APPARATUS AND MICROWAVE SUPPLY METHOD

CROSS-REFERENCE TO RELATED APPLICATIONS

This application is based on and claims priority from Japanese Patent Application No. 2013-216739, filed on Oct. 17, 2013, with the Japan Patent Office, the disclosure of which is incorporated herein in its entirety by reference.

TECHNICAL FIELD

Various aspects and embodiments of the present disclosure are related to a microwave plasma processing apparatus and a microwave supply method.

BACKGROUND

There is a microwave plasma processing apparatus which uses high density plasma excited by a microwave electric field. The microwave plasma processing apparatus includes, for example, a processing container for use in performing a plasma processing on a substrate to be processed, a microwave generator configured to generate microwaves which convert a processing gas into plasma within the processing container, and a waveguide configured to guide the microwaves generated by the microwave generator into the processing container. Further, the microwave plasma processing apparatus includes a planar antenna provided with a plurality of slots which transmit the microwaves guided by the waveguide. In the microwave plasma processing apparatus, the microwaves are radiated from a slot antenna into the processing container to ionize the processing gas within the processing container, thereby exciting the plasma.

However, in the microwave plasma processing apparatus, in order to uniformly perform the plasma processing on the entire surface of an object to be processed, it is requested that the plasma excited by the microwaves be uniformly distributed in the processing space within the processing container. In this regard, a technology is known in which a distributor is installed at a rear end side of a microwave generator to distribute the microwaves supplied from the microwave generator to a plurality of waveguides using a prescribed distribution ratio by the distributor and the distributed microwaves are radiated from an antenna to a central side and a peripheral side of the processing space. See, e.g., Japanese Laid-Open Patent Publication Nos. H09-63793, H03-191074, 2007-213994, and 2011-014542.

SUMMARY

A microwave plasma processing apparatus according to an aspect of the present disclosure includes a processing container configured to define a processing space, a microwave generator configured to generate microwaves for generating plasma of a processing gas introduced into a processing space, a distributor configured to distribute the microwaves to a plurality of waveguides using a variable distribution ratio, an antenna installed in the processing container to seal the processing space and configured to radiate the microwaves distributed by the distributor to each of the plurality of waveguides to the processing space, a monitor unit configured to monitor a power of the microwaves distributed to each of the plurality of waveguides by the distributor, and a distribution ratio control unit configured to correct the distribution ratio used for distribution of the microwaves by the distributor based on a difference between a ratio of the power of the microwaves monitored by the monitor unit and a previously designated distribution ratio.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
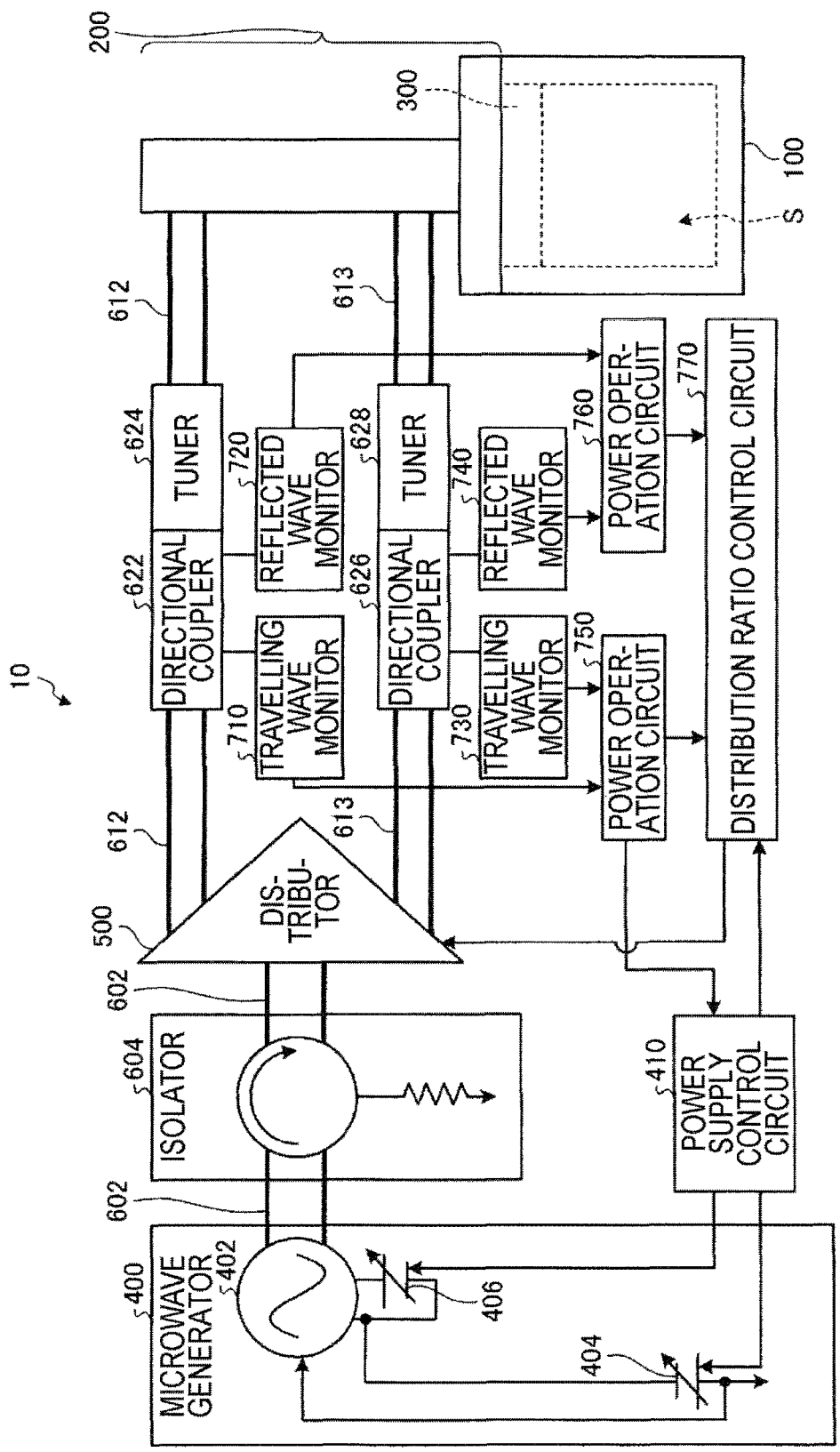
FIG. 1 is a block diagram illustrating an exemplary configuration of a microwave plasma processing apparatus according to a first embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

However, in the related art described above, matters for improving a distribution accuracy of microwaves in a case where the microwave distributed to each of a plurality of waveguides are radiated from the antenna are not taken into account.

That is, in the related art described above, when the microwaves distributed to each of a plurality of waveguides are radiated from the antenna, some of the microwaves may be reflected from an antenna side towards the distributor. The reflected wave obtained due to some of the microwaves reflected from the antenna side towards the distributor which generates deviation between a power ratio of the microwave actually distributed to each of the plurality of waveguides by the distributor and a prescribed distribution ratio. However, in the related art described above, since the distribution ratio used for the distribution of the microwave by the distributor is fixed, it is difficult to cancel the generated deviation. Therefore, a distribution accuracy of the microwave may be reduced in the related art described above.

A microwave plasma processing apparatus according to an aspect of the present disclosure includes a processing container configured to define a processing space, a microwave generator configured to generate microwaves for generating plasma of a processing gas introduced into a processing space, a distributor configured to distribute the microwaves to a plurality of waveguides using a variable distribution ratio, an antenna installed in the processing container to seal the processing space and configured to radiate the microwaves distributed by the distributor to each of the plurality of waveguides to the processing space, a monitor unit configured to monitor a power of the microwaves distributed to each of the plurality of waveguides by the distributor, and a distribution ratio control unit configured to correct the distribution ratio used for distribution of the microwaves by the distributor based on a difference between a ratio of the power of the microwaves monitored by the monitor unit and a previously designated distribution ratio.

According to one aspect of the microwave plasma processing apparatus of the present disclosure, the effect of improving a distribution accuracy of the microwave may be achieved in a case where microwave distributed to each of a plurality of waveguides are radiated from the antenna.

Hereinafter, descriptions will be made on embodiments of a microwave plasma processing apparatus and a microwave supply method of the present disclosure in detail with reference to accompanying drawings in detail. In the meantime, the present disclosure is not limited to the embodiments. Respective embodiments may be appropriately combined within a range which does not cause contradiction between processing contents of the embodiments.

A microwave plasma processing apparatus according to an aspect of the present disclosure includes a processing container configured to define a processing space, a microwave generator configured to generate microwaves for generating plasma of a processing gas introduced into a processing space, a distributor configured to distribute the microwaves to a plurality of waveguides using a variable distribution ratio, an antenna installed in the processing container to seal the processing space and configured to radiate the microwaves distributed by the distributor to each of the plurality of waveguides to the processing space, a monitor unit configured to monitor a power of the microwaves distributed to each of the plurality of waveguides by the distributor, and a distribution ratio control unit configured to correct the distribution ratio used for distribution of the microwaves by the distributor based on a difference between a ratio of the power of the microwaves monitored by the monitor unit and a previously designated distribution ratio.

In the microwave plasma processing apparatus according to an embodiment of the present disclosure, the distributor includes a movable member and distributes the microwaves to the plurality of waveguides according to a position of the movable member, and the distribution ratio control unit adjusts the position of the movable member to make the difference closer to 0 (zero) so as to correct the distribution ratio used for distribution of the microwaves by the distributor.

In the microwave plasma processing apparatus, when generation of the microwaves is started by the microwave generator, the distribution ratio control unit corrects the distribution ratio used for the distribution of the microwaves by the distributor.

In the microwave plasma processing apparatus, when generation of the microwaves is started by the microwave generator and the plasma generated by the microwaves also become stable, the distribution ratio control unit corrects the distribution ratio used for the distribution of the microwaves by the distributor.

The microwave plasma processing apparatus further includes a phase shifter installed on at least one of the plurality of waveguides and configured to shift a phase of microwaves which propagate through at least one of the waveguides using a variable phase shift amount, a waveform detector configured to detect a waveform of the microwaves to be distributed to each of the plurality of waveguides by the distributor, and a phase shift amount control unit configured to calculate a phase difference between the microwaves which propagates through at least one waveguides and the microwave which propagates through a waveguide which is different from at least one waveguides using a detected result by the waveform detector and correct the phase shift amount used for the phase shift of the microwave by the phase shifter based on a difference between the calculated phase difference and the previously designated phase shift amount.

The microwave plasma processing apparatus further includes a phase shifter installed on at least one of the plurality of waveguides and configured to shift a phase of the microwaves which propagates through at least one of the waveguides using a variable phase shift amount, a voltage detector configured to detect a voltage of the microwaves distributed to each of the plurality of waveguides by the distributor, and a phase shift amount control unit configured to calculate a phase difference between the microwave which propagates through at least one waveguides and the microwaves which propagate through a waveguide which is different from at least one waveguide using a detected result by the voltage detector and correct the phase shift amount used for the phase shift of the microwaves by the phase shifter based on a difference between the calculated phase difference and the previously designated phase shift amount.

The microwave plasma processing apparatus further includes an isolator installed on each of the plurality of waveguides and configured to isolate the reflected waves obtained when some of the microwaves are distributed to each of the plurality of waveguides by the distributor and are reflected from the antenna side towards the distributor.

A microwave supply method according to an aspect of the present disclosure is a microwave supply method in which microwave are supplied by using a microwave plasma processing apparatus which includes a processing container configured to define a processing space, a microwave generator configured to generate microwaves for generating plasma of a processing gas introduced into a processing space, a distributor configured to distribute the microwave to a plurality of waveguides using a variable distribution ratio, an antenna installed in the processing container to seal the processing space and configured to radiate the microwave distributed by the distributor to each of the plurality of waveguides to the processing space, and which includes monitoring a power of the microwave distributed to each of the plurality of waveguides by the distributor, and correcting the distribution ratio used for the distribution of microwave by the distributor based on a difference between a ratio of the power of the monitored microwaves and a previously designated power ratio.

(Microwave Plasma Processing Apparatus According to First Embodiment)

Figure 2:
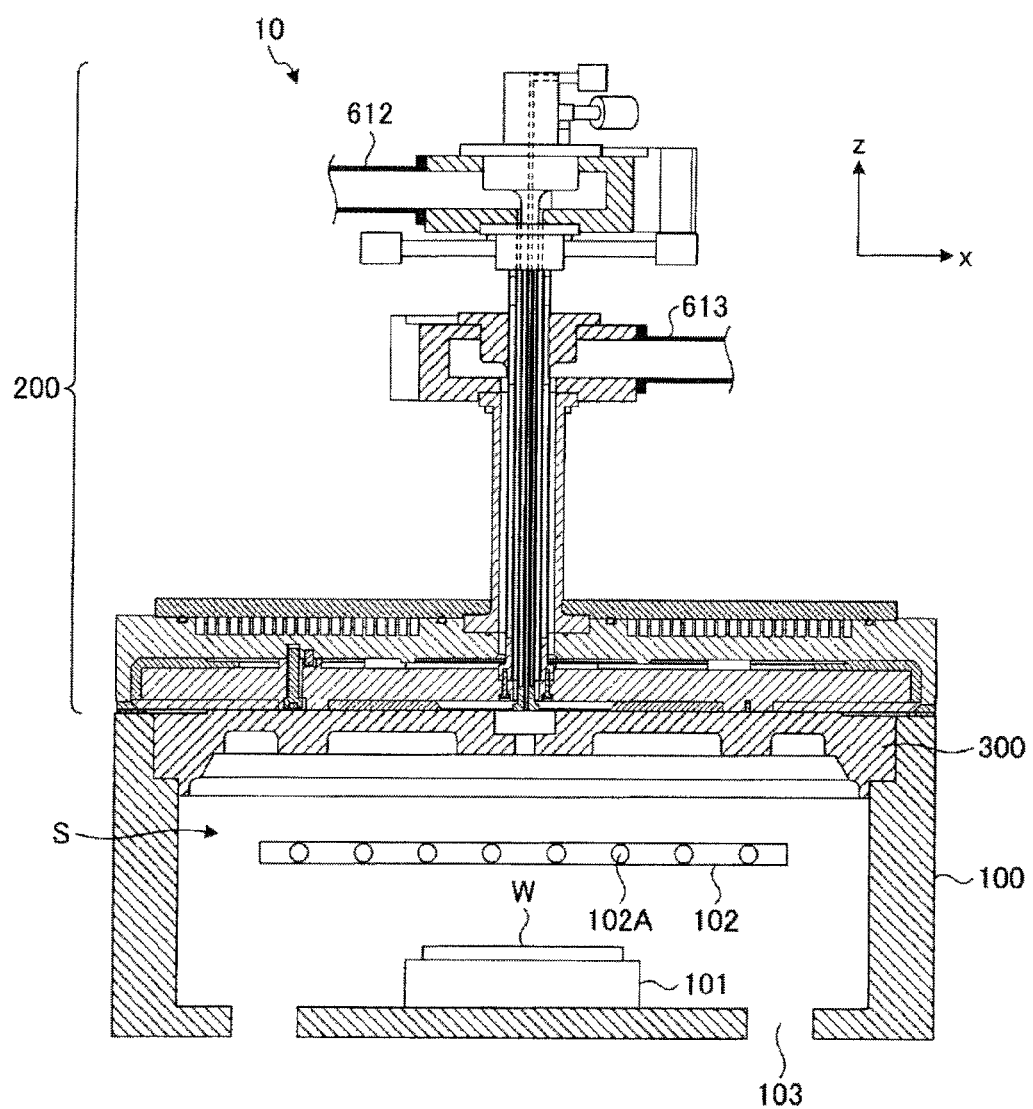
FIG. 2 is a vertical cross-sectional view illustrating an exemplary internal configuration of the microwave plasma processing apparatus according to the first embodiment.

FIG. 1 is a block diagram illustrating an exemplary configuration of a microwave plasma processing apparatus according a first embodiment. FIG. 2 is a vertical cross-sectional view illustrating an exemplary internal configuration of the microwave plasma processing apparatus according the first embodiment. In the meantime, for convenience of explanation, some of constitutional elements are omitted in FIG. 2.

As illustrated in FIGS. 1 and 2, the microwave plasma processing apparatus 10 includes a processing container 100, a microwave generator 400, a distributor 500, a slot antenna 200, and a dielectric window 300. Further, the microwave plasma processing apparatus 10 includes a support table 101 on which a substrate W is placed and a gas shower 102 which supplies a processing gas into the processing container 100 through an opening 102A from a gas supply source (not illustrated).

The processing container 100 defines a processing space S used for performing a plasma processing on the substrate W placed on the support table 101. Further, an opening 103 connected to an exhaust system such as a vacuum pump is formed in the processing container 100.

The microwave generator 400 generates microwaves for generating a plasma of the processing gas to be supplied to the processing space S. Specifically, the microwave generator 400 includes a magnetron 402, an anode power supply 404, and a filament power supply 406. The magnetron 402 oscillates the microwaves as high frequency waves. The anode power supply 404 supplies an electrical current to an anode electrode of the magnetron 402 according to a control signal supplied from a power supply control circuit 410 which will be described later. The filament power supply 406 supplies an electrical current to a filament which is a cathode electrode of the magnetron 402 according to a control signal supplied from the power supply control circuit 410 which will be described later. When the electrical current is supplied to the anode electrode and the cathode electrode of the magnetron 402, microwaves for generating the plasma of the processing gas supplied to the processing space S are oscillated.

Further, the power supply control circuit 410 is connected to the anode power supply 404 and the filament power supply 406 of the microwave generator 400. The power supply control circuit 410 obtains an electric power (hereinafter, referred to as a "designated power") Ps designated by a user using, for example, a user interface (not illustrated). The power supply control circuit 410 obtains a total power Pf of travelling waves calculated by a power operation circuit 750 which will be described later. The power supply control circuit 410 outputs control signals for controlling the anode power supply 404 and the filament power supply 406 to the anode power supply 404 and the filament power supply 406, respectively, so as to make the total power Pf of the travelling wave equal to the designated power Ps. Accordingly, generation of microwaves is started by the microwave generator 400. Further, when the control signals are output, the power supply control circuit 410 outputs a MW-ON signal, which is a signal notifying that the generation of microwaves is started, to a distribution ratio control circuit 770 which will be described later.

Further, a waveguide 602 connecting the microwave generator 400 and the distributor 500 is connected to the microwave generator 400. The waveguide 602 guides the microwaves generated by the microwave generator 400 to the distributor 500. The waveguide 602 is provided with an isolator 604. The isolator 604 separates the reflected waves of the microwaves from the slot antenna 200 side by a circulator and converts the separated reflected waves into heat by a dummy load. The microwaves generated by the microwave generator 400 propagate inside of the waveguide 602 and are guided to distributor 500 through the isolator 604.

The distributor 500 distributes the microwaves input from the waveguide 602 to a plurality of waveguides. In the present embodiment, the distributor 500 distributes the microwaves input from the waveguide 602 to two waveguides 612 and 613. For example, the distributor 500 includes a T-shaped waveguide having a single input port and two output ports and a movable member which is movable within the T-shaped waveguide. The movable member is, for example, a stub or a movable short-circuiting plate. Also, the distributor 500 distributes the microwaves input from the waveguide 602 to the input port to two waveguides 612 and 613 depending on a position of the movable member. Further, a distribution ratio used for distribution of the microwaves by the distributor 500 is variable. A control value of the distribution ratio of the distributor 500, that is, a position adjustment value of the movable member of the distributor 500 is input by, for example, the distribution ratio control circuit 770 which will be described later. That is, the distributor 500 distributes the microwaves input from the waveguide 602 to two waveguides 612 and 613 using the distribution ratio input by the distribution ratio control circuit 770.

A directional coupler 622 and a tuner 624 are provided on the waveguide 612. The directional coupler 622 branches and outputs some of the microwaves distributed by the distributor 500 to the travelling wave monitor 710 which will be described later. Hereinafter, the microwaves distributed to the travelling wave monitor 710 may also be referred to as a "travelling wave". Further, the directional coupler 622 branches and outputs some of the microwaves obtained by being reflected from the slot antenna 200 side toward the distributor 500 to a reflected wave monitor 720 which will be described later. Hereinafter, the microwaves obtained by being reflected to the reflected wave monitor 720 may also be referred to as a "reflected wave".

The tuner 624 matches an impedance at the distributor 500 side and an impedance at the slot antenna 200 side. The microwaves distributed to the waveguide 612 by the distributor 500 propagate the waveguide 612 as the travelling waves and are guided to the slot antenna 200 through the directional coupler 622 and the tuner 624.

A directional coupler 626 and a tuner 628 are provided on the waveguide 613. The directional coupler 622 branches and outputs some of the travelling waves which propagate inside the waveguide 613 in a direction away from the distributor 500 to the travelling wave monitor 730 which will be described later. Further, the directional coupler 626 branches and outputs some of the reflected waves to the reflected wave monitor 740 which will be described later.

The tuner 628 matches an impedance at the distributor 500 side and an impedance at the slot antenna 200 side. The microwaves distributed to the waveguide 612 by the distributor 500 propagate the waveguide 613 as the travelling wave and are guided to the slot antenna 200 through the directional coupler 626 and the tuner 628.

The slot antenna 200 is installed on the processing container 100 to seal the processing space S. The dielectric window 300 is installed on a surface of the slot antenna 200 at the processing container 100 side. The slot antenna 200 includes an inner waveguide and an outer waveguide which are two independent waveguides configured to transmit microwaves therein. The inner waveguide and the outer waveguide are connected to two waveguides 612 and 613, respectively. The slot antenna 200 transmits the microwaves distributed to two waveguides 612 and 613 by the distributor 500 to the dielectric window 300 through the inner waveguide and the outer waveguide and radiates the transmitted microwaves to the processing space S through the dielectric window 300. The microwaves radiated from the slot antenna 200 to the processing space S ionize the processing gas supplied to the processing space S to excite the plasma of the processing gas. In the meantime, an exemplary entire configuration of the slot antenna 200 will be described later.

As illustrated in FIG. 1, the microwave plasma processing apparatus 10 includes the travelling wave monitor 710, the reflected wave monitor 720, the travelling wave monitor 730, the reflected wave monitor 740, the power operation circuit 750, a power operation circuit 760, and the distribution ratio control circuit 770.

The travelling wave monitor 710 monitors a power Pf1 of a travelling wave propagating inside of the waveguide 612 (hereinafter, the power Pf1 of the travelling wave may also be referred to as a "travelling wave power Pf1") and outputs the monitored travelling wave power Pf1 to the power operation circuit 750. The travelling wave monitor 710 is an example of a monitor unit.

Figure 3:
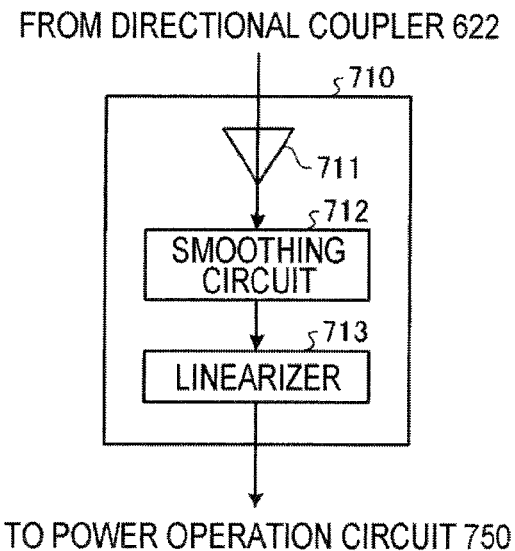
FIG. 3 is a view illustrating an exemplary configuration of a travelling wave monitor in the first embodiment.

Here, descriptions will be made on an exemplary configuration of the travelling wave monitor 710 with reference to FIG. 3. FIG. 3 is a view illustrating an exemplary configuration of a travelling wave monitor in the first embodiment. As illustrated in FIG. 3, the travelling wave monitor 710 includes a detector 711, a smoothing circuit 712, and a linearizer 713. The detector 711 receives the travelling wave propagating inside of the waveguide 612 from the directional coupler 622 as an input and detects a voltage of the received travelling wave to output the voltage of the detected travelling wave to the smoothing circuit 712. The smoothing circuit 712 smoothes the voltage of the detected travelling wave by the detector 711 and outputs the smoothed voltage of the travelling wave to the linearizer 713. The linearizer 713 converts linearly the voltage of the travelling wave smoothed by the smoothing circuit 712 to the travelling wave power Pf1 and outputs the converted travelling wave power Pf1 to the power operation circuit 750.

Referring back to FIG. 1, the reflected wave monitor 720 monitors a power Pr1 of a reflected wave propagating inside of the waveguide 612 (hereinafter, the power Pr1 of the reflected power may also be referred to as a "reflected wave power Pr1") and outputs the monitored reflected wave power Pr1 to the power operation circuit 760. In the meantime, since the reflected wave monitor 720 basically has the same configuration as that of the travelling wave monitor 710 illustrated in FIG. 3, except that the reflected wave propagating inside of the waveguide 612 is received in the reflected wave monitor 720, a detailed description thereof will be omitted.

The travelling wave monitor 730 monitors a power Pf2 of a travelling wave propagating inside of the waveguide 613 (hereinafter, the power Pf2 of the travelling wave may also be referred to as a "travelling wave power Pf2") and outputs the monitored travelling wave Pf2 to the power operation circuit 750. The travelling wave monitor 730 is an example of the monitor unit. In the meantime, since the travelling wave monitor 730 basically has the same configuration as that of the travelling wave monitor 710 illustrated in FIG. 3, except that the travelling wave propagating inside of the waveguide 613 is received in the travelling wave monitor 730, a detailed description thereof will be omitted.

The reflected wave monitor 740 monitors a power Pr2 of a reflected wave propagating inside of the waveguide 613 (hereinafter, the power Pr2 of the reflected wave may also be referred to as a "reflected wave power Pr2") and outputs the monitored reflected wave power Pr2 to the power operation circuit 760. In the meantime, since the reflected wave monitor 740 basically has the same configuration as that of the travelling wave monitor 710 illustrated in FIG. 3, except that the reflected wave propagating inside of the waveguide 613 is received in the reflected wave monitor 740, a detailed description thereof will be omitted.

The power operation circuit 750 calculates the total power Pf of the travelling wave (hereinafter, referred to as a "total travelling wave power Pf") which is a total sum of the travelling wave power Pf1 and the travelling wave power Pf2 to output the calculated total travelling wave power Pf to the power supply control circuit 410 and the distribution ratio control circuit 770.

Figure 4:
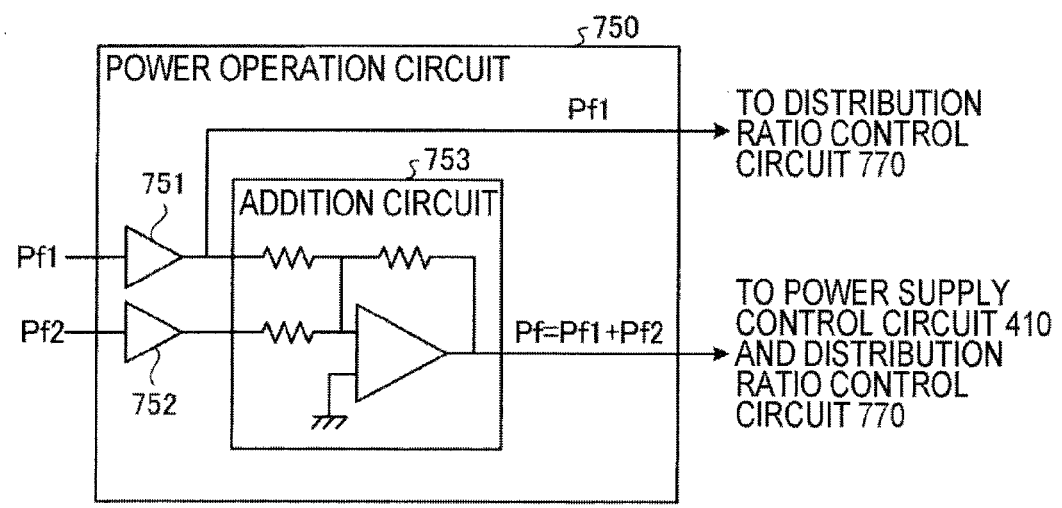
FIG. 4 is a view illustrating an exemplary configuration of a power operation circuit in the first embodiment.

Here, descriptions will be made on an exemplary configuration of the power operation circuit 750 with reference to FIG. 4. FIG. 4 is a view illustrating an exemplary configuration of a power operation circuit in the first embodiment. As illustrated in FIG. 4, the power operation circuit 750 includes an amplifier 751, an amplifier 752, and an addition circuit 753. The amplifier 751 receives the travelling wave power Pf1 from the travelling wave monitor 710 as an input, amplifies the received travelling wave power Pf1, and outputs the amplified travelling wave power Pf1 to the distribution ratio control circuit 770 and the addition circuit 753. The amplifier 752 receives the travelling wave power Pf2 from the travelling wave monitor 730 as an input, amplifies the received travelling wave power Pf2, and outputs the amplified travelling wave power Pf2 to the addition circuit 753. The addition circuit 753 adds the travelling wave power Pf1 and the travelling wave power Pf2 to calculate the total travelling wave power Pf and outputs the calculated total travelling wave power Pf to the power supply control circuit 410 and the distribution ratio control circuit 770.

Referring back to FIG. 1, the power operation circuit 760 calculates the total power Pr of the reflected wave (hereinafter, referred to as a "total reflected wave power Pr") which is a total of the reflected wave power Pr1 and the reflected wave power Pr2 and outputs the calculated total reflected wave power Pr to the distribution ratio control circuit 770.

Figure 5:
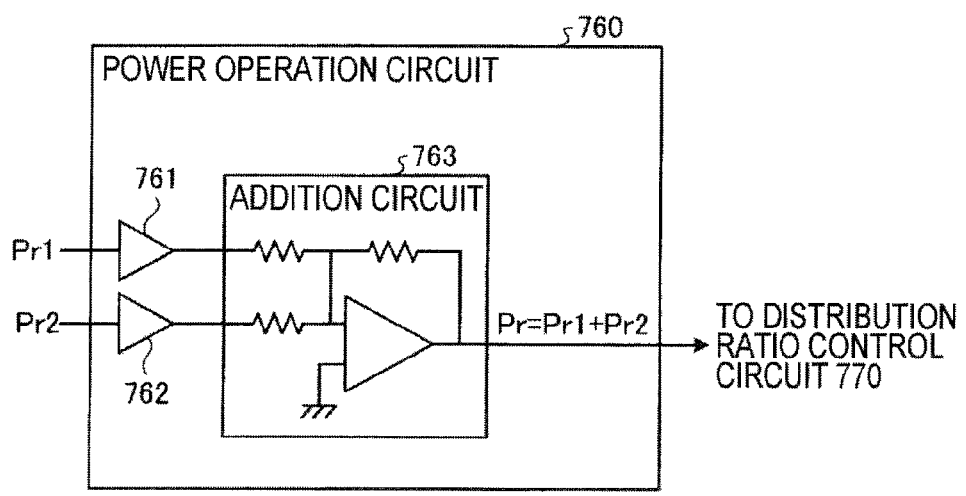
FIG. 5 is a view illustrating another exemplary configuration of a power operation circuit in the first embodiment.

Here, descriptions will be made on an exemplary configuration of the power operation circuit 760 with reference to FIG. 5. FIG. 5 is a view illustrating an exemplary configuration of a power operation circuit in the first embodiment. As illustrated in FIG. 5, the power operation circuit 760 includes an amplifier 761, an amplifier 762, and an addition circuit 763. The amplifier 761 receives the reflected wave power Pr1 from the reflected wave monitor 720 as an input, amplifies the received reflected wave power Pr1, and outputs the amplified reflected wave power Pr1 to the addition circuit 763. The amplifier 762 receives the reflected wave power Pf2 from the reflected wave monitor 740 as an input, amplifies the received reflected wave power Pr2, and outputs the amplified travelling wave power Pr2 to the addition circuit 763. The addition circuit 763 adds the reflected wave power Pr1 and the reflected wave power Pr2 to calculate the total reflected wave power Pr and outputs the calculated total reflected wave power Pr to the distribution ratio control circuit 770.

Referring back to FIG. 1, the distribution ratio control circuit 770 controls the distribution ratio used for distribution of the microwaves by the distributor 500.

Figure 6:
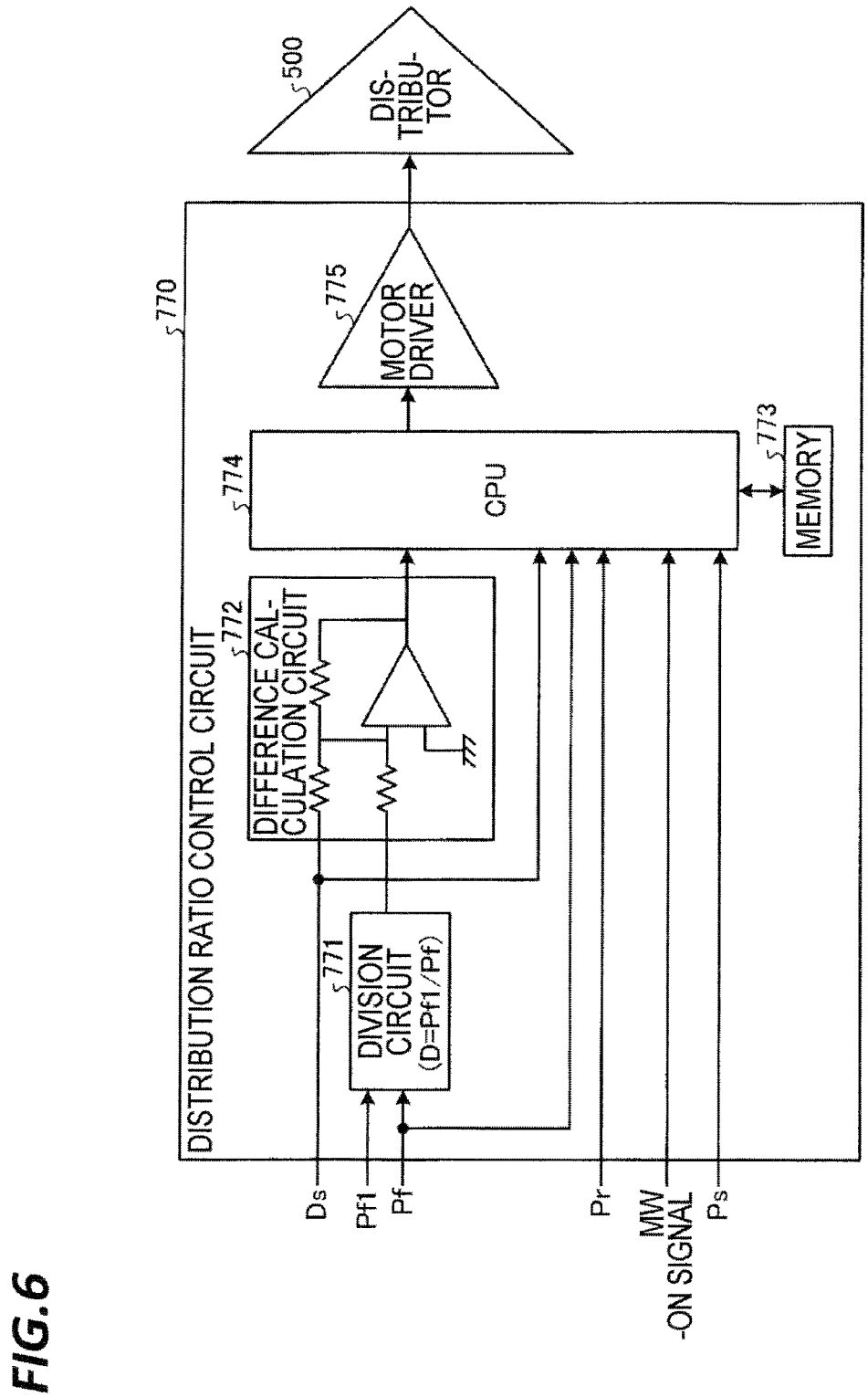
FIG. 6 is a view illustrating an exemplary configuration of a distribution ratio control circuit in the first embodiment.

Here, descriptions will be made on an exemplary configuration the distribution ratio control circuit 770 with reference to FIG. 6. FIG. 6 is a view illustrating an exemplary configuration of a distribution ratio control circuit in the first embodiment. The distribution ratio control circuit 770 includes a division circuit 771, a difference calculation circuit 772, a memory 773, a CPU (Central Processing Unit) 774, and a motor driver 775.

The division circuit 771 receives the travelling wave power Pf1 and the total travelling wave power Pf from the power operation circuit 750 as an input. The division circuit 771 divides the travelling wave power Pf1 by the total travelling wave power Pf to calculate an effective distribution ratio D (=Pf1/Pf) which is a ratio of the power of microwaves to be distributed to the waveguide 612 to the total power of microwaves to be distributed to each of the waveguides 612 and 613. The division circuit 771 outputs the calculated effective distribution ratio D to the difference calculation circuit 772. The effective distribution ratio D is an example of a ratio of the power of the monitored microwaves.

The difference calculation circuit 772 receives the effective distribution ratio D from the division circuit 771 as an input. The difference calculation circuit 772 obtains a distribution ratio Ds of the distributor 500 designated by a user using, for example, a user interface (not illustrated). Hereinafter, the distribution ratio designated by the user may also be referred to as the "designated distribution ratio" appropriately. The difference calculation circuit 772 subtracts the designated distribution ratio Ds from the effective distribution ratio D to calculate a difference ΔD (=D−Ds) between the effective distribution ratio D and the designated distribution ratio Ds and outputs the calculated ΔD to the CPU 774.

Figure 7:
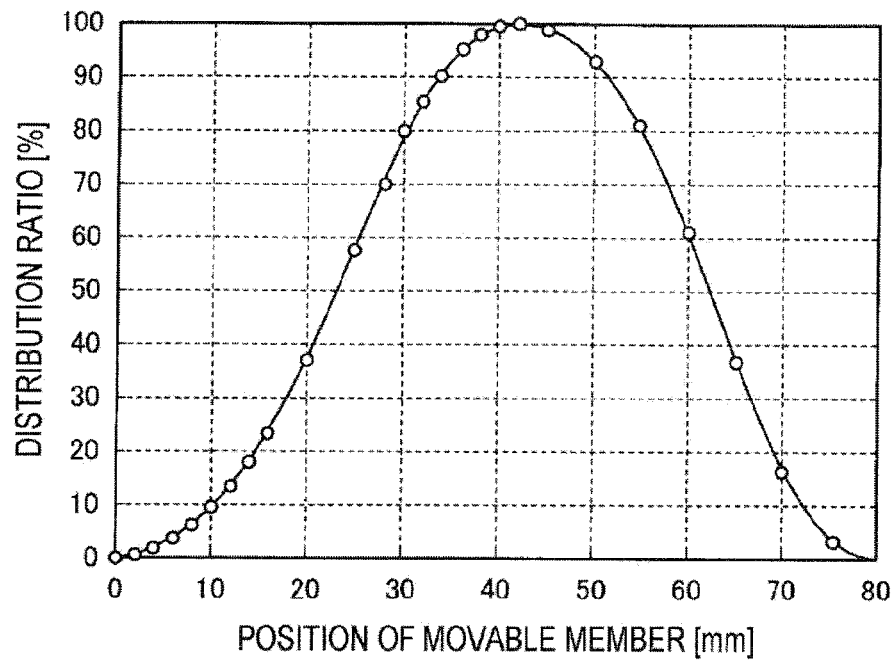
FIG. 7 is a graph illustrating an exemplary data structure of information stored in a memory in the first embodiment.

The memory 773 stores information used for the distribution ratio control by the CPU 774. FIG. 7 is a graph illustrating an exemplary data structure of information stored in a memory in the first embodiment. As illustrated in FIG. 7, the memory 773 stores a correspondence relationship between a position [mm] of the movable member included in the distributor 500 and a distribution ratio [%] of the distributor 500 according to a position of the movable member as the information used for the distribution ratio control by the CPU 774. In the meantime, in FIG. 7, it is assumed that the distribution ratio [%] is a ratio of the power of microwave to be distributed to the waveguide 612 to the total of the power of microwave to be distributed from the distributor 500 to the waveguides 612 and 613 in a situation where the distributor 500 is in a matched state. Further, the distribution ratio may become controllable in a range of 0 to 100 [%] in a case where the position of the movable member exists in a range of 0 to 40 [mm] or 40 to 80 [mm]. When the position of the movable member is adjusted in a forward direction in a range of 0 to [mm], the distribution ratio increases, and when the position of the movable member is adjusted in a reverse direction in a range of 40 to 80 [mm], the distribution ratio increases. Hereinafter, descriptions will be made on a case where the position of the movable member is in a range of 0 to 40 [mm].

The CPU 774 corrects the distribution ratio used for the distribution of microwaves by the distributor 500 based on the difference ΔD (=D−Ds) between the effective distribution ratio D and the designated distribution ratio Ds. Specifically, the CPU 774 adjusts the position of the movable member within the distributor 500 to make the difference ΔD closer to 0 (zero) using the motor driver 775 so as to correct the distribution ratio used for the distribution of microwave by the distributor 500.

Further, when generation of the microwaves is started by the microwave generator 400, the CPU 774 corrects the distribution ratio used for the distribution of microwaves by the distributor 500. Specifically, when generation of the microwaves is started by the microwave generator and the plasma generated within the processing container 100 by the microwaves also becomes stable, the CPU 774 corrects the distribution ratio used for the distribution of microwaves by the distributor. The CPU 774 is an example of the distribution ratio control.

The motor driver 775 drives a motor according to an instruction from the CPU 774 to move the position of the movable member within the distributor 500. In the meantime, the motor driver 775 may detect the position of the movable member within the distributor 500 by using, for example, an encoder and perform a feedback control for the position of the movable member within the distributor 500 using the detected result.

Figure 8:
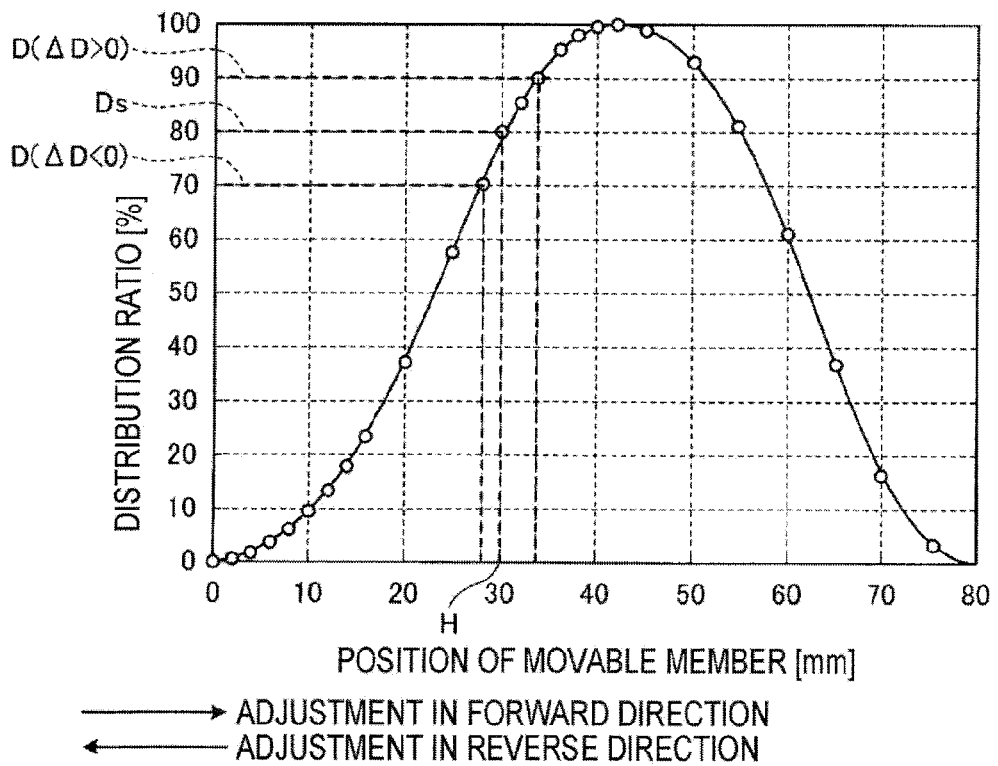
FIG. 8 is a graph illustrating an exemplary distribution ratio control by a CPU in the first embodiment.

Here, descriptions will be made on an exemplary configuration of example of a CPU 774 with reference to FIG. 8. FIG. 8 is a graph illustrating an exemplary distribution ratio control by a CPU in the first embodiment. FIG. 8 illustrates a correspondence relationship between a position [mm] of the movable member included in the distributor 500 and a distribution ratio [%] of the distributor according to the position of the movable member, which is stored in the memory 773.

The CPU 774 obtains the designated power Ps and the designated distribution ratio Ds using the user interface (not illustrated) and, as illustrated in FIG. 8, obtains the position H of the movable member corresponding to the designated distribution ratio Ds from the memory 773. In the example of FIG. 8, it is assumed that the designated distribution ratio Ds is 80 [%] and the position H of the movable member corresponding to the designated distribution ratio Ds is a position which is spaced apart from a reference position by 0 to 30 [mm]. The CPU 774 sets the position H of the movable member obtained from the memory 773 in the distributor 500.

The CPU 774 determines whether an MW-ON signal is input from the power supply control circuit 410. When it is determined that the MW-ON signal is not input, that is, generation of the microwaves is not started by the microwave generator 400, the CPU 774 waits.

In the meantime, when it is determined that the MW-ON signal is input, that is, generation of the microwaves is started by the microwave generator 400, the CPU 774 determines whether the plasma generated within the processing container 100 by the microwaves becomes stable. Specifically, when the total travelling wave power Pf and the total reflected wave power Pr are obtained from the power operation circuit 750 and the power operation circuit 760, respectively, and the total travelling wave power Pf is equal to the designated power Ps and the total reflected wave power Pr is 0[W], the CPU 774 determines that the plasma becomes stable.

When it is determined that the plasma generated within the processing container 100 by the microwaves does not become stable, the CPU 774 waits.

In the meantime, when it is determined that the plasma generated by the microwave within the processing container 100 becomes stable, the CPU 774 obtains a difference $\Delta D$ (=D−Ds) between the effective distribution ratio D and the designated distribution ratio Ds from the difference calculation circuit 772 and starts correction of the distribution ratio using the difference $\Delta D$.

When the difference $\Delta D$ (=D−Ds) is less than 0 (zero), in other words, when the effective distribution ratio D is smaller than the designated distribution ratio Ds, the CPU 774 performs the following processing. That is, the CPU 774, as illustrated in FIG. 8, adjusts the position H of the movable member along the forward direction to make the difference $\Delta D$ closer to 0 (zero) so as to correct the distribution ratio used for the distribution of the microwaves by the distributor 500. Here, the forward direction is a direction away from the reference position 0 [mm]. In the example of FIG. 8, it is assumed that the designated distribution ratio Ds is 80 [%] and the effective distribution ratio D is 70 [%] which is smaller than the designated distribution ratio Ds. In this case, the position of the movable member corresponding to the effective distribution ratio D is 28 [mm] and a difference between the position H of the movable member corresponding to the designated distribution ratio Ds and the position of the movable member corresponding to the effective distribution ratio D is 2 [mm]. Therefore, the CPU 774 forwardly adjusts the position H of the movable member along the forward direction by 2 [mm] to make the difference $\Delta D$ (=D−Ds) closer to 0 (zero) so as to correct the distribution ratio used for the distribution of microwave by the distributor 500. When the difference $\Delta D$ becomes 0, that is, $\Delta D=0$ by the operation, the CPU 774 repeatedly performs a fine adjustment for the distributor 500.

In the meantime, when the difference $\Delta D$ (=D−Ds) is larger than 0, in other words, when the effective distribution ratio D is larger than the designated distribution ratio Ds, the CPU 774 performs the following processing. That is, as illustrated in FIG. 8, the CPU 774 adjusts the position H of the movable member along the reverse direction to make the difference $\Delta D$ closer to 0 (zero) so as to correct the distribution ratio used for the distribution of the microwaves by the distributor 500. Here, the reverse direction is a direction approaching the reference position 0 [mm]. In the example of FIG. 8, it is assumed that the designated distribution ratio Ds is 80[%] and the effective distribution ratio D is 90[%] which is larger than the designated distribution ratio Ds. In this case, the position of the movable member corresponding to the effective distribution ratio D is 33[mm] and a difference between the position H of the movable member corresponding to the designated distribution ratio Ds and the position of the movable member corresponding to the effective distribution ratio D is 3 [mm] Therefore, the CPU 774 reversely adjusts the position H of the movable member along the reverse direction by 3 [mm] to make the difference $\Delta D$ (=D−Ds) closer to 0 (zero) to correct the distribution ratio used for the distribution of microwave by the distributor 500. When the difference $\Delta D$ becomes 0 by the operation, the CPU 774 repeatedly performs a fine adjustment for the distributor 500.

In the meantime, when the difference $\Delta D$(=D−Ds) is 0, in other words, when the designated distribution ratio Ds is equal to the effective distribution ratio D, the CPU 774 does not correct the distribution ratio used for the distribution of the microwaves by the distributor 500.

Figure 9:
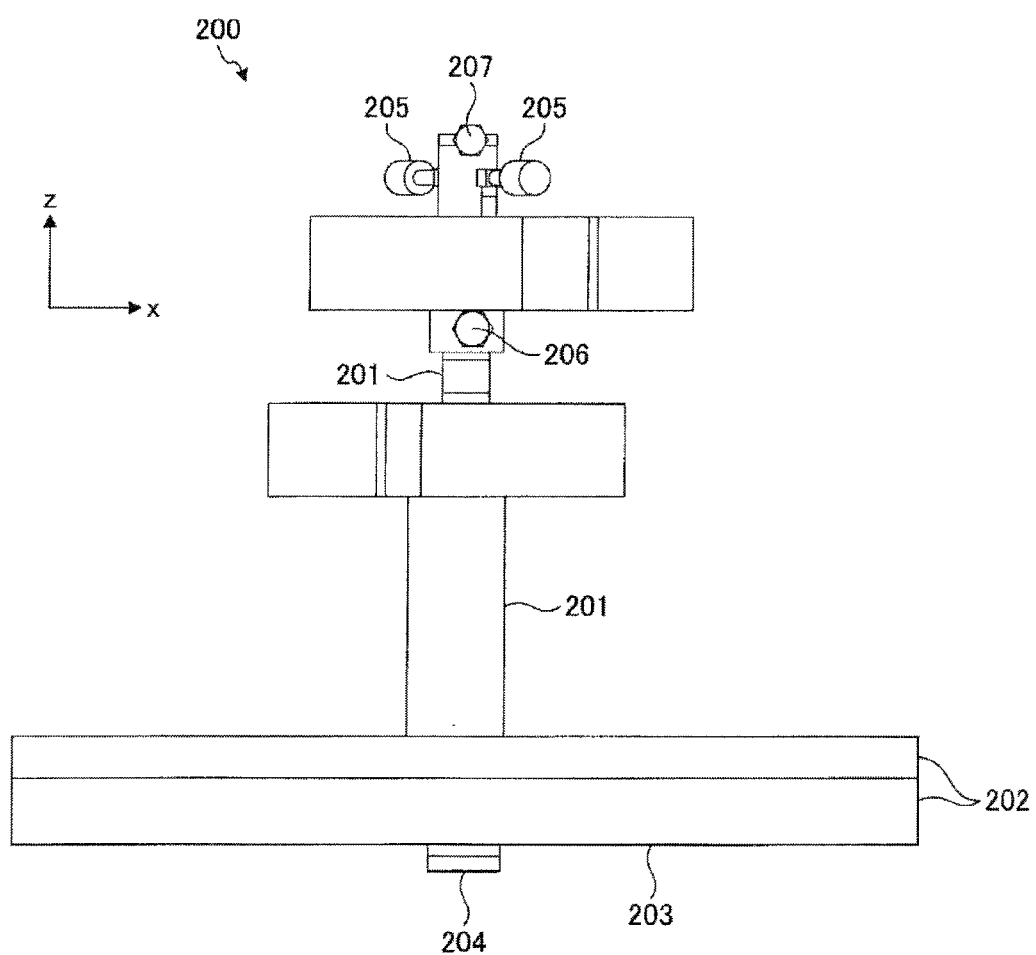
FIG. 9 is a front view illustrating an external appearance of an exemplary entire structure of a slot antenna in the first embodiment.
Figure 10:
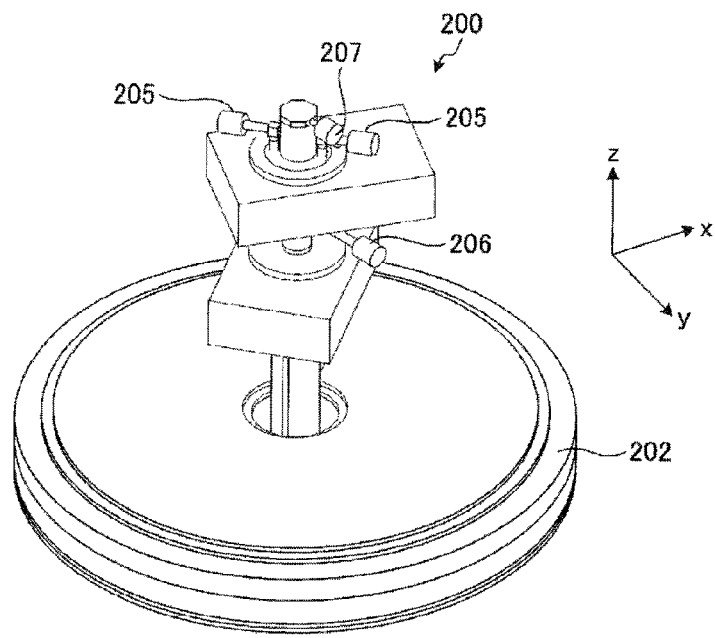
FIG. 10 is a perspective view illustrating another external appearance the exemplary entire structure of the slot antenna in the first embodiment when viewed from the top side.
Figure 11:
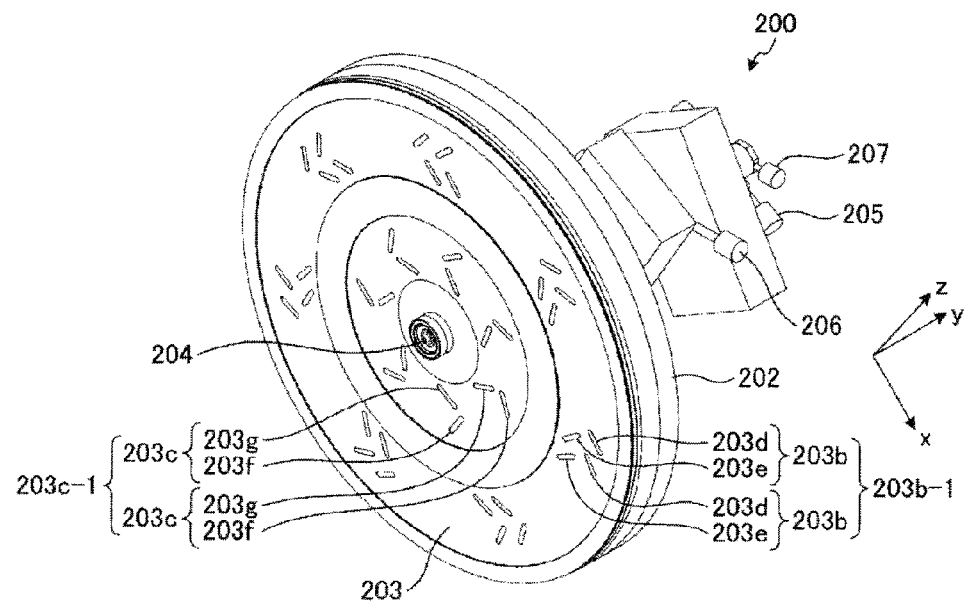
FIG. 11 is a view illustrating another external appearance of the exemplary entire structure of the slot antenna in the first embodiment when viewed from the bottom side.

Here, an example of the entire configuration of the slot antenna 200 illustrated in FIGS. 1 and 2 will be described with reference FIGS. 9 to 19. FIGS. 9 to 11 are views illustrating external appearances of an exemplary entire structure of the slot antenna in the first embodiment. In the examples illustrated in FIGS. 9 to 11, the dielectric window 300 is not illustrated for convenience of explanation. As illustrated in FIGS. 9 to 11, the slot antenna 200 includes a coaxial waveguide 201, a cooling plate 202, a slot antenna plate 203, a gas supply hole 204 configured to supply the processing gas into the processing container 100, a cooling pipe 205, a cooling pipe 206 configured to cool the coaxial waveguide 201, and a gas inlet hole 207 through which the processing gas is supplied to the slot antenna 200.

The slot antenna plate 203 has, for example, a thin circular plate shape. A plurality of microwave transmission slot pairs 203c and a plurality of microwave transmission slot pairs 203b are formed in the slot antenna plate 203. Both surfaces of the slot antenna plate 203 in the plate thickness direction may be flat. The slot antenna plate 203 includes the plurality of microwave transmission slot pairs 203c provided at an inner peripheral side of the slot antenna plate 203 and the plurality of microwave transmission slot pairs 203b provided at an outer peripheral side. The plurality of microwave transmission slot pairs 203b and 203c penetrate through the slot antenna plate 203 in the plate thickness direction. Each of the plurality of microwave transmission slots 203c includes one pair of slots 203f and 203g which are elongated holes which extend in intersecting or orthogonal directions. Each of the plurality of microwave transmission slot pairs 203b includes one pair of slots 203d and 203e which are elongated holes which extend in intersecting or orthogonal directions. The plurality of microwave transmission slot pairs 203c are disposed at regular intervals in a circumferential direction of the inner peripheral side and the plurality of microwave transmission slot pairs 203b are disposed at regular intervals in a circumferential direction of the outer peripheral side.

In other words, the plurality of microwave transmission slot pairs 203c form an inner slot group 203c-1 in which a plurality of pairs of slots 203f and 203g are disposed along a peripheral direction of the slot antenna plate 203. Further, the plurality of microwave transmission slot pairs 203b form an outer slot group 203b-1 formed in such a way that a plurality of pairs of slots 203d and 203e are disposed along the peripheral direction of the slot antenna plate 203 at an outer side than the inner slot group 203c-1 in the radial direction of the slot antenna plate 203.

The inner slot group 203c-1 transmits the microwaves guided to the central side of the dielectric window 300 by the inner waveguide which will be described later and the outer slot group 203b-1 transmits the microwaves guided to the peripheral side of the dielectric window 300 by the outer waveguide which will be described later.

Figure 12:
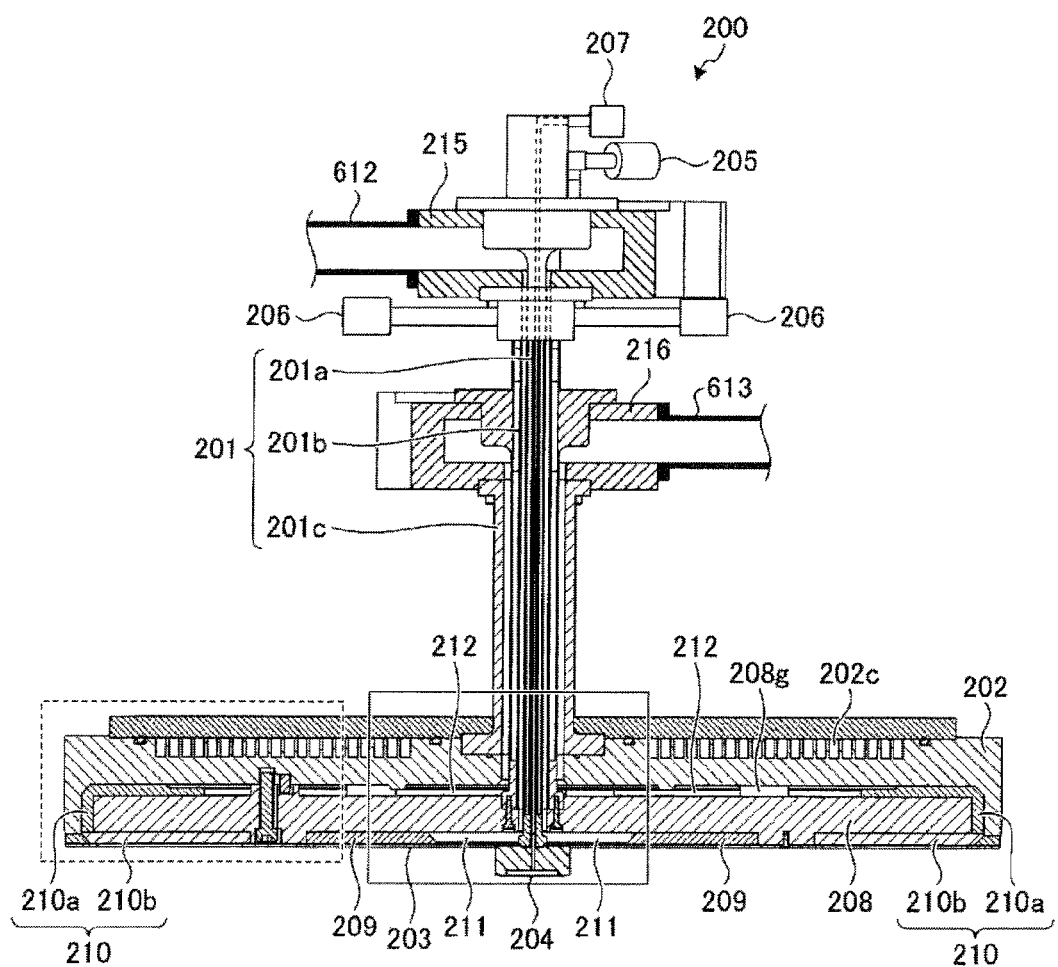
FIG. 12 is a cross-sectional view illustrating an exemplary configuration of the slot antenna in the first embodiment in detail.
Figure 13:
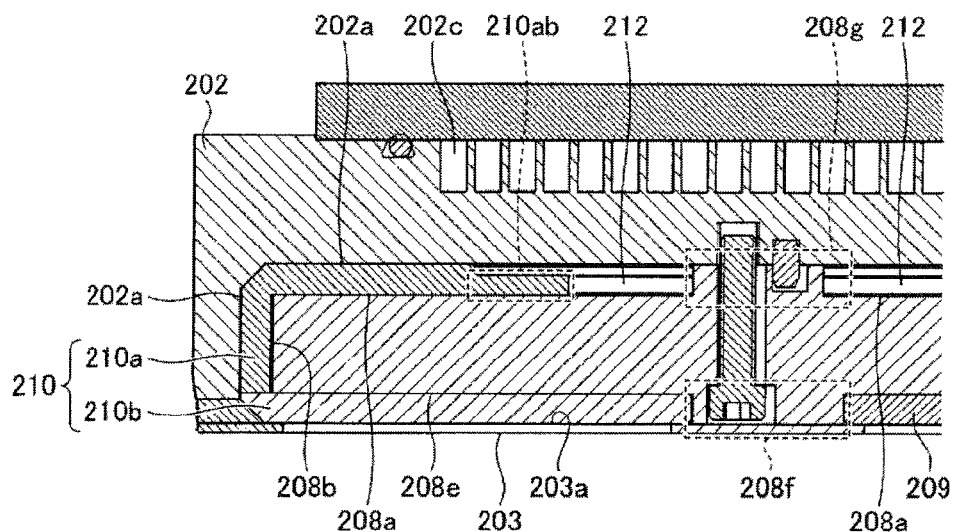
FIG. 13 is a cross-sectional view illustrating a part of the cross-sectional view of the slot antenna illustrated in FIG. 12 in an enlarged scale.
Figure 14:
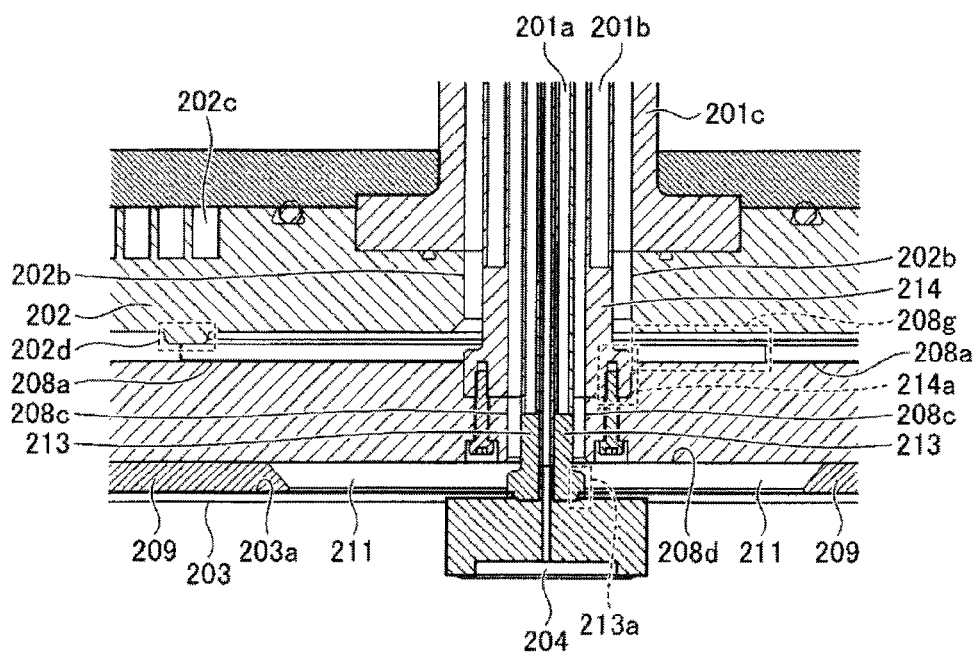
FIG. 14 is a cross-sectional view illustrating a part of the cross-sectional view of the slot antenna illustrated in FIG. 12 in an enlarged scale.

FIG. 12 is a cross-sectional view illustrating an exemplary configuration of the slot antenna in the first embodiment in detail. FIGS. 13 and 14 are cross-sectional views illustrating a part of the cross-sectional view of the slot antenna illustrated in FIG. 12 in an enlarged scale. FIGS. 13 and 14 correspond to portions encircled by a broken line and a solid line in FIG. 12, respectively. As illustrated in FIGS. 12 to 14, the slot antenna 200 includes a cooling plate 202, an intermediate metal body 208, a slot antenna plate 203, a coaxial waveguide 201, and mode converters 215 and 216.

As illustrated in FIGS. 12 to 14, the cooling plate 202 is installed to be spaced apart from a contour surface of an intermediate conductor 201b of the coaxial waveguide 201. The intermediate conductor 201b will be described later. The cooling plate 202 includes a flow hole 202c for flowing the refrigerant therethrough. The cooling plate 202 is used for cooling the intermediate metal body 208 or the dielectric window 300.

The intermediate metal body 208 is installed to be spaced apart from the processing container 100 side of the cooling plate 202. The intermediate metal body 208 includes a convex portion 208f having a doughnut shape which divides a processing container 100 side surface of the intermediate metal body 208 into a central side portion and a outer peripheral side portion. The thickness of the intermediate metal body 208 may be constant. More specifically, the thickness of the intermediate metal body 208 may be the same, except for a portion where the convex portion 208f is formed.

The slot antenna plate 203 is installed on the processing container 100 side surface of the intermediate metal body 208 to be in contact with the convex portion 208f. The slot antenna plate 203 includes, on the processing container 100 side surface of the slot antenna plate 203, microwave transmission slot pairs 203c provided on a portion located closer to the central side than a portion contacting with the convex portion 208f and microwave transmission slot pairs 203b provided on a portion located closer to the outer peripheral side than a portion contacting with the convex portion 208f, as slots for radiating the microwaves.

The coaxial waveguide 201 is formed in a through hole which continuously penetrates the cooling plate 202 and the intermediate metal body 208. In the example of FIG. 12, the processing container 100 side end of the coaxial waveguide 201 is located within the through hole. The through hole is formed at the central side portion formed by the convex portion 208f in the intermediate metal body 208.

Further, the coaxial waveguide 201 includes an inner conductor 201a, an intermediate conductor 201b, and an outer conductor 201c. Each of the inner conductor 201a, the intermediate conductor 201b, and the outer conductor 201c has a cylindrical shape and may be installed in such that the diametric centers of the conductors are consistent with each other. The inner conductor 201a and the intermediate conductor 201b are installed such that the contour surface of the inner conductor 201a and an inner diameter surface of the intermediate conductor 201b are spaced apart from each other. Further, the intermediate conductor 201b and the outer conductor 201c are installed such that the contour surface of the intermediate conductor 201b and an inner diameter surface of the outer conductor 201c are spaced apart from each other.

The mode converter 215 is connected to the waveguide 612 which is one of two waveguides to which the microwaves are distributed by the distributor 500 and is connected to the space between the intermediate conductor 201b and the inner conductor 201a installed in a hollow portion of the intermediate conductor 201b. The mode converter 215 converts the mode of the microwaves transmitted from the waveguide 612 and supplies the mode-converted microwave to the space between the inner conductor 201a and the intermediate conductor 201b.

The mode converter 215 is connected to the waveguide 613 which is the other one of two waveguides to which the microwaves are distributed by the distributor 500 and is connected to the space between the outer conductor 201c and the intermediate conductor 201b installed in a hollow portion of the outer conductor 201c. The mode converter 215 converts the mode of the microwaves transmitted from the waveguide 613 and supplies the mode-converted microwaves to the space between the intermediate conductor 201b and the outer conductor 201c.

Here, in the coaxial waveguide 201, the hollow portion of the inner conductor 201a serves as a supply path through which the processing gas flown into the gas supply hole 204 is supplied to the gas inlet hole 207. Further, in the coaxial waveguide 201, the space between the intermediate conductor 201b and the inner conductor 201a installed in the hollow portion of the intermediate conductor 201b and the space between the outer conductor 201c and the intermediate conductor 201b installed in the hollow portion of the outer conductor 201 allow the microwaves to be transmitted from the waveguide 612 and the waveguide 613, respectively. That is, each of the hollow portion formed by the contour surface of the inner conductor 201a and the inner diameter surface of the intermediate conductor 201b and the hollow portion formed by the contour surface of the intermediate conductor 201b and the inner diameter surface of the outer conductor 201c transmit the microwaves.

A first member 213 and a second member 214 are installed on the end portion of the coaxial waveguide 201. For example, the first member 213 is installed on the processing container 100 side end portion of the inner conductor 201a of the coaxial waveguide 201. The first member 213 provided with the through hole includes a first step portion 213a which protrudes toward a central space located nearer to the central side than the convex portion 208f in the space between the slot antenna plate 203 and the intermediate metal body 208. A length of the diameter in the first step portion 213a is equal to or less than the inner diameter of the intermediate conductor 201b. Further, in the example illustrated in FIG. 14, the first member 213 is fixed to the gas supply hole 204.

Further, for example, the second member 214 is installed on the processing container 100 side end portion of the intermediate conductor 201b of the coaxial waveguide 201. The second member 214 provided with the through hole includes a third step portion 214a which protrudes toward the space between the intermediate metal body 208 and the cooling plate 202. A length of the diameter in the third step portion 214a is equal to or less than the inner diameter of the outer conductor 201c. Further, in the example illustrated in FIG. 14, the second member 213 is fixed to the intermediate metal body 208.

As illustrated in FIG. 14, the first member 213 and the second member 214 is formed in a shape having a step rather than a tapered shape. Further, the first member 213 is installed to be spaced apart from the intermediate metal body 208 and the second member 214 is installed to be spaced apart from the cooling plate 202.

In the meantime, the supplementary descriptions will be made on an exemplary relationship of the through hole, the coaxial waveguide 201, the first member 213, and the second member 214. In the example illustrated in FIG. 14, the inner conductor 201a of the coaxial waveguide 201 penetrates the through hole formed in the cooling plate 202. Further, the end portion of the intermediate conductor 201b is located within the through hole of the cooling plate 202 and the second member 214 is installed on the end portion of the intermediate conductor 201b. Further, the end portion of the outer conductor 201c of the coaxial waveguide 201 is fixed to the cooling plate 202.

Further, in the example illustrated in FIG. 14, the end portion of the inner conductor 201a of the coaxial waveguide 201 is located within the through hole of the intermediate metal body 208 and the first member 214 is installed on the end portion of the inner conductor 201a. Further, a gap exists between the intermediate conductor 201b of the coaxial waveguide 201 and the side 202b of the through hole of the cooling plate 202 and a gap exists between the inner conductor 201a of the coaxial waveguide 201 and the side 208c of the through hole of the intermediate metal body 208. Thus, each of these gaps forms a portion of the waveguide which transmits the microwaves.

Figure 15:
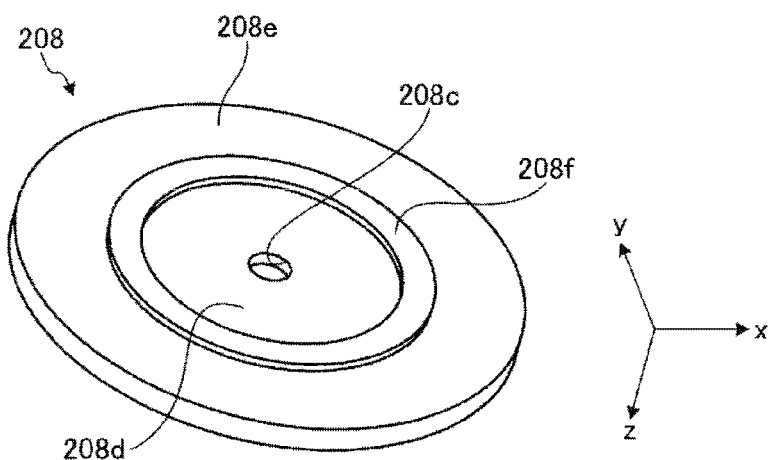
FIG. 15 is a perspective view illustrating an external appearance of an exemplary intermediate metal body in the first embodiment when viewed from the dielectric window side.
Figure 16:
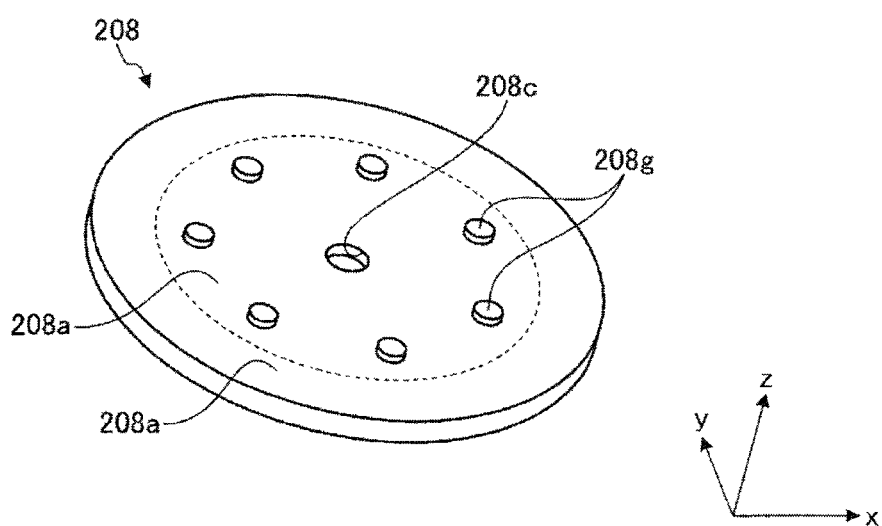
FIG. 16 is a perspective view illustrating another external appearance of the exemplary intermediate metal body in the first embodiment when viewed from the cooling plate side.

FIG. 15 is a perspective view illustrating an external appearance of an exemplary intermediate metal body in the first embodiment when viewed from the dielectric window side. FIG. 16 is a perspective view illustrating another external appearance of the exemplary intermediate metal body in the first embodiment when viewed from the cooling plate side.

Here, the intermediate metal body 208 will be further described with reference to FIGS. 15 and 16. As illustrated in FIG. 15, the intermediate metal body 208 includes a convex portion 208f having a doughnut shape. As a result, the intermediate metal body 208 contacts with the slot antenna plate 203 at the doughnut shaped convex portion 208f. In other words, the doughnut-shaped convex portion 208f of the intermediate metal body 208 is formed on the top surface of the slot antenna plate 203.

Here, in the intermediate metal body 208, a central space is formed between a bottom surface 208d of the intermediate metal body 208 and a top surface 203a of the slot antenna plate 203 in a range from a central side of the intermediate metal body 208 to the doughnut shaped convex portion 208f. In the example illustrated in FIG. 12, the central space corresponds to the space in which an inner wave retardation plate 209 to be described later is installed and an empty space 211. Further, in the intermediate metal body 208, an outer peripheral space is formed between a bottom surface 208e of the intermediate metal body 208 and the top surface 203a of the slot antenna plate 203 in a range from the outer periphery of the intermediate metal body 208 to the doughnut-shaped convex portion 208f of the intermediate metal body 208. In the example illustrated in FIG. 12, the outer peripheral space corresponds to the space in which an outer wave retardation plate 210b to be described later is installed.

Further, as illustrated in FIG. 16, the intermediate metal body 208 includes the cooling plate 202 and one or plural convex portions 208g. Here, the intermediate metal body 208 is in contact with the cooling plate 202 at one or plural convex portions 208g. In other words, the cooling plate 202 is installed on one or plural convex portions 208g of the intermediate metal body 208. That is, the intermediate metal body 208 and the cooling plate 202 are installed such that the contour surface of the intermediate metal body 208 and the cooling plate 202 are space apart from each other, except for one or plural convex portions 208g. In other words, the intermediate metal body 208 and the cooling plate 202 are installed such that the bottom surface 202a of the cooling plate and the top surface 208a and the side surface 208b of the intermediate metal body 208 are spaced apart from each other, except for the one or plural convex portions 208g.

Here, the cooling plate 202 includes the convex portion 202d protruding toward the space between the intermediate metal body 208 and the cooling plate 202. The convex portion 202d is not in contact with the intermediate metal body 208.

Further, the intermediate metal body 208 and the cooling plate 202 are in contact with each other at the one or plural convex portions 208g formed on the intermediate metal body 208. In other words, the intermediate metal body 208 and the cooling plate 202 are installed to be spaced apart from each other, except for the one or plural convex portions 208g of the intermediate metal body 208. In the meantime, the intermediate metal body 208 may increase a cooling capability by providing a flow hole connected with the flow hole 202c of the cooling plate 202 through the one or plural convex portions 208g with which the cooling plate 202 and the intermediate metal body 208 are in contact with each other. Further, the one or plural convex portions 208g may be formed on a portion where the outer wave retardation plate 210 is not installed.

Further, in the slot antenna 200, a wave retardation plate is installed on a portion of the contour surface of the intermediate metal body 208. Specifically, the slot antenna 200 includes an inner wave retardation plate 209 and the outer wave retardation plate 210.

Figure 17:
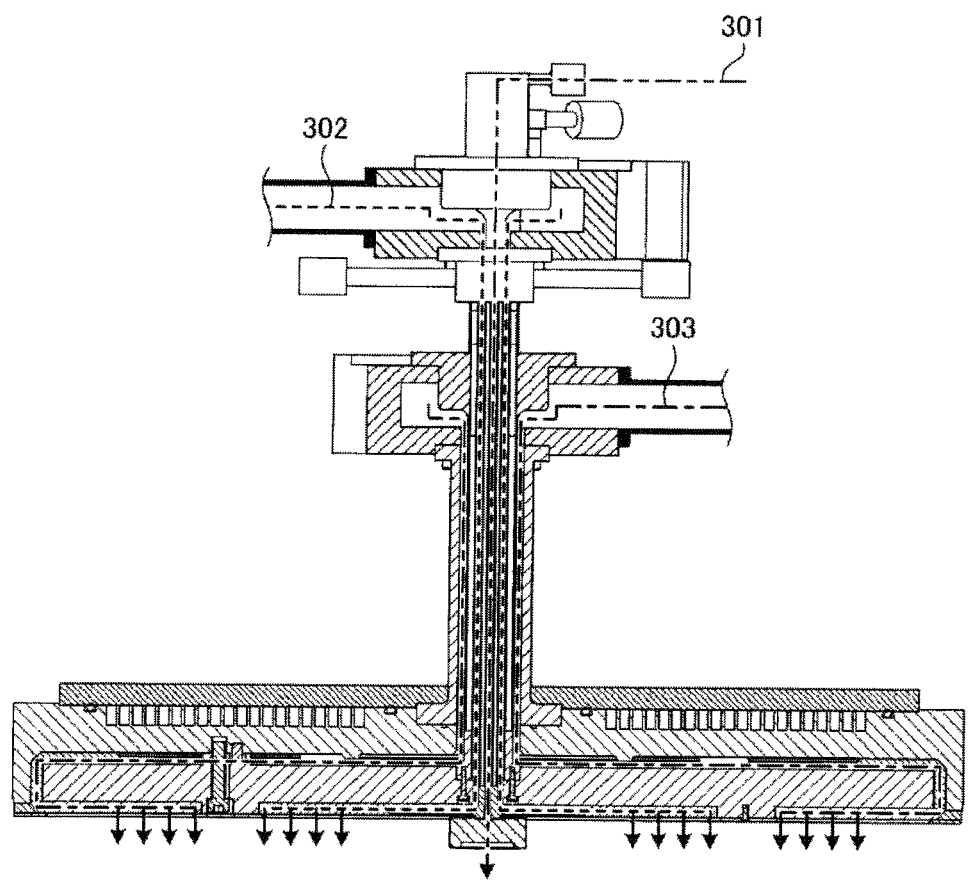
FIG. 17 is a view illustrating a supply path of processing gas and a waveguide of microwaves which are installed in the slot antenna in the first embodiment.

FIG. 17 is a view illustrating a supply path of the processing gas and a waveguide of microwaves which are installed in the slot antenna in the first embodiment. An arrow 301 of FIG. 17 indicates a supply path of the processing gas formed in the slot antenna 200, an arrow 302 indicates a guiding path of the microwaves supplied to the inner slot group 203c-1 installed on the inner peripheral side of the slot antenna plate 203 and an arrow 303 indicates the waveguide of the microwaves supplied to the outer slot group 203b-1 installed on the outer peripheral side of the slot antenna plate 203.

As indicated by the arrow 301 in FIG. 17, in the slot antenna 200, when the processing gas is supplied from the processing gas supply source (not illustrated) to the gas inlet hole 207, the processing gas passes through the hollow portion of the inner conductor 201a which penetrates the cooling plate 202 and the intermediate metal body 208 and is supplied into the processing container 100 from the gas supply hole 204.

Further, as indicated by the arrow 302 in FIG. 17, the slot antenna 200 includes an inner waveguide which is a waveguide which transmits the microwaves in the central space located nearer to the central part than the convex portion 208f in the space between the slot antenna plate 203 and the intermediate metal body 208 through the space between the inner conductor 201a and the intermediate conductor 201b so as to transmit the microwaves to the microwave transmission slot pairs 203c (inner slot group 203c-1). Further, in the inner waveguide, the inner wave retardation plate 209 is installed on the top of the microwave transmission slot pairs 203c (inner slot group 203c-1).

That is, in the inner waveguide, the microwaves supplied from the waveguide 612 through the mode converter 215 sequentially pass through the hollow portion formed by the contour surface of the inner conductor 201a and the inner diameter surface of the intermediate conductor 201b, the hollow portion formed by the contour surface of the inner conductor 201a and the side 208c of the through hole formed at the intermediate metal body 208, the space between the first member 213 and the intermediate metal body 208, the empty space 212 formed by the bottom surface of the intermediate metal body 208 and the top surface of the slot antenna plate 203 and the inner wave retardation plate 209. Then, the microwaves are discharged from the microwave transmission slot pairs 203c (inner slot group 203c-1) toward the central side of the dielectric window 300.

Further, as indicated by the arrow 303 in FIG. 17, the slot antenna 200 includes an outer waveguide which is a waveguide which transmits the microwaves in the outer space located nearer to the outer peripheral side than the convex portion 208f among the space between the slot antenna plate 203 and the intermediate metal body 208 through the space between the intermediate conductor 201b and the outer conductor 201c and the space between the intermediate metal body 208 and the cooling plate 202 in sequence so as to transmit the microwaves to the transmission slot pairs 203b (outer slot group 203b-1). Further, in the outer waveguide, the outer wave retardation plate 210 is installed on the top of the microwave transmission slot pairs 203b (outer slot group 203b-1). Further, the inner waveguide and the outer waveguide do not communicate with each other.

That is, in the outer waveguide, the microwaves supplied from the waveguide 613 through the mode converter 215 sequentially pass through the hollow portion formed by the contour surface of the intermediate conductor 201b and the inner diameter surface of the outer conductor 201c, the hollow portion formed by the contour surface of the intermediate conductor 201b and the side 202b of the cooling plate 202, the space between the second member 214 and the cooling plate 202, the empty space 211 formed by the top surface 208a of the intermediate metal body 208 and the bottom surface 202a of the cooling plate 202, the outer wave retardation plate 210a and an outer wave retardation plate 210b and then, the microwave are discharged from the microwave transmission slot pairs 203b (outer slot group 203b-1) toward the peripheral side of the dielectric window 300.

As described above, when a configuration in which the inner waveguide and the outer waveguide do not communicate with each other is employed, the interference of microwaves between the inner waveguide and the outer waveguide may be avoided.

Although the first embodiment illustrates an example in which the inner waveguide and the outer waveguide are not communicated with each other, the inner waveguide and the outer waveguide are not limited thereto and may be communicated with each other via the through hole having a size which does not transmit the microwaves.

Figure 18:
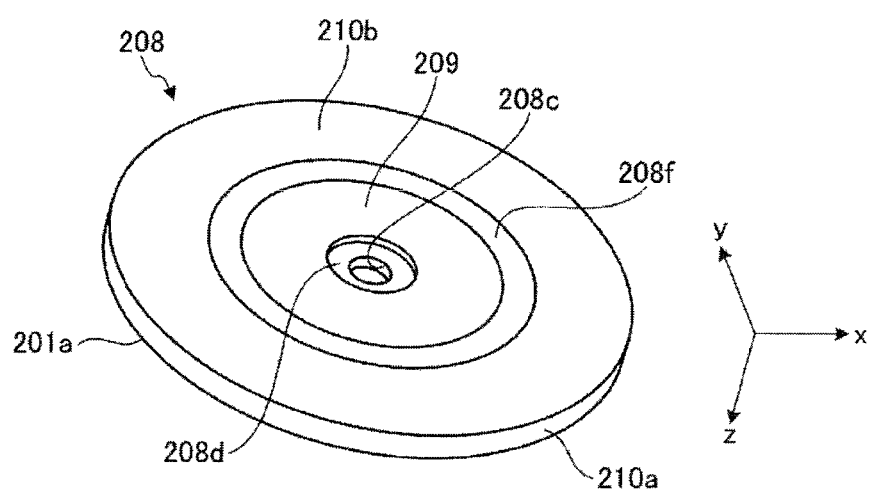
FIG. 18 is a perspective view illustrating an external appearance when viewed from the dielectric window side to illustrate a relationship of the intermediate metal body, the inner wave retardation plate, and the outer wave retardation plate in the first embodiment.
Figure 19:
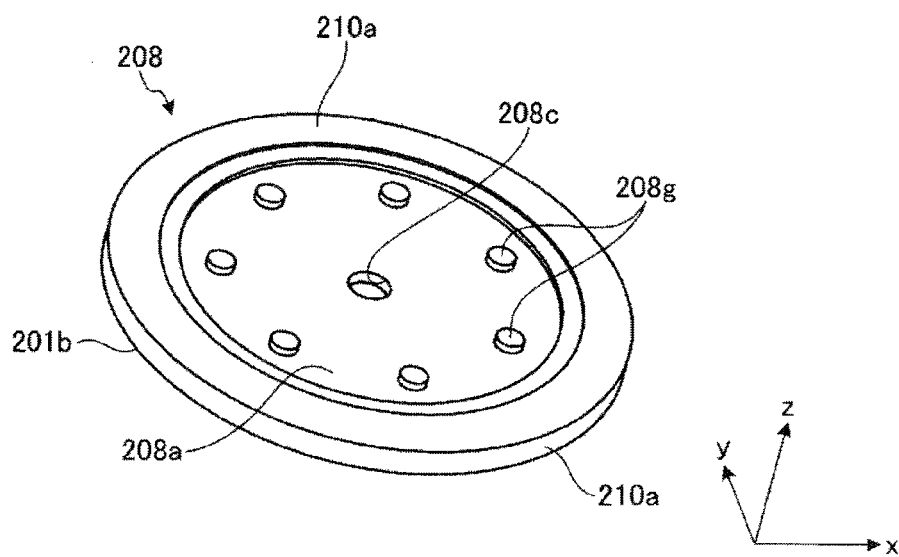
FIG. 19 is a perspective view illustrating another external appearance when viewed from the cooling plate side to illustrate a relationship of the intermediate metal body, the inner wave retardation plate, and the outer wave retardation plate in the first embodiment.

FIG. 18 is a perspective view illustrating an external appearance when viewed from the dielectric window side to illustrate a relationship of the intermediate metal body, the inner wave retardation plate, and the outer wave retardation plate in the first embodiment. FIG. 19 is a perspective view illustrating an external appearance when viewed from the cooling plate side to illustrate a relationship of the intermediate metal body, the inner wave retardation plate, and the outer wave retardation plate in the first embodiment.

As illustrated in FIGS. 18 and 19, the inner wave retardation plate 209 is installed on a portion or all portions including a part above the microwave transmission slot pairs 203c of the central space. Further, in the central space, the inner wave retardation plate 209 has a slope or a step at an interface between the inner wave retardation plate 209 and the empty space 211 in which the inner wave retardation plate 209 is not installed.

That is, as illustrated in FIGS. 12 to 19, the inner wave retardation plate 209 is installed from the convex portion 208f of the intermediate metal body 208 toward the inner peripheral side over a predetermined length to fill the space formed between the bottom surface 208d of the intermediate metal body 208 and the top surface 203a of the slot antenna plate 203. As a result, in the portion located between the convex portion 208f of the intermediate metal body 208 and the inner peripheral side in the space formed between the bottom surface 208d of the intermediate metal body 208 and the top surface 203a of the slot antenna plate 203, the inner wave retardation plate 209 is installed in a range within a predetermined length from the convex portion 208f of the intermediate metal body 208 and a range from the through hole of the intermediate metal body 208 to a portion where the inner wave retardation plate 209 is installed forms the empty space 211. Further, the inner wave retardation plate 209 may have a slanted shape at an interface surface with the space 211.

As illustrated in FIGS. 18 and 19, the outer wave retardation plate 210 is formed to be continued with the outer peripheral space and a portion of the space between the intermediate metal body 208 and the cooling plate 202. For example, the outer wave retardation plate 210 includes a first outer wave retardation plate 210b installed in the outer peripheral space and a second outer wave retardation plate 210a installed to be continued from the end portion of the first outer wave retardation plate 210b and at a portion of the space between the intermediate metal body 208 and the cooling plate 202.

That is, as illustrated in FIGS. 12 to 19, the outer wave retardation plate 210b is installed to fill the space formed between the bottom surface 208e of the intermediate metal body 208 and the top surface 203a of the slot antenna plate 203. Further, the outer wave retardation plate 210a is installed over a predetermined length from the end portion of the outer wave retardation plate 210b to fill the space formed between the bottom surface 202a of the cooling plate 202 and the top surface 208a and the side surface 208b of the intermediate metal body 208.

Further, the outer wave retardation plate 210a installed in a range of a predetermined length from the outer periphery of the intermediate metal body 208 in the top surface 208a of the intermediate metal body 208. As a result, in the space formed between the top surface 208a of the intermediate metal body 208 and the bottom surface 202a of the cooling plate 202, a range from the through hole of the intermediate metal body 208 to a portion where the outer wave retardation plate 210a is installed forms the empty space 212. The one or plural convex portions 208g, with which the cooling plate 202 and the intermediate metal body 208 are in contact, is formed in the empty space 212 from the through hole of the intermediate metal body 208 to a portion where the outer wave retardation plate 210a is installed. Further, the outer wave retardation plate 210 includes a second step portion 210ab protruding toward the central side at the interface between the outer wave retardation plate 210 and a portion where the outer wave retardation plate 210 is not installed, in the space between the intermediate metal body 208 and the cooling plate 202. A length of a portion where the outer wave retardation plate 210 is installed in the inner waveguide may become larger than that of a portion where the inner wave retardation plate 209 is installed in the outer waveguide.

Descriptions will be made on a relationship between the outer waveguide and one or plural convex portions 208g formed on the intermediate metal body 208. As described above, the intermediate metal body 208 and the cooling plate 202 are in contact with each other at the one or plural convex portions 208g formed on the intermediate metal body 208. Here, the one or plural convex portions 208g are formed in the empty space 211. In other words, the one or plural convex portions 208g are not surrounded by the outer wave retardation plate 210.

Figure 20:
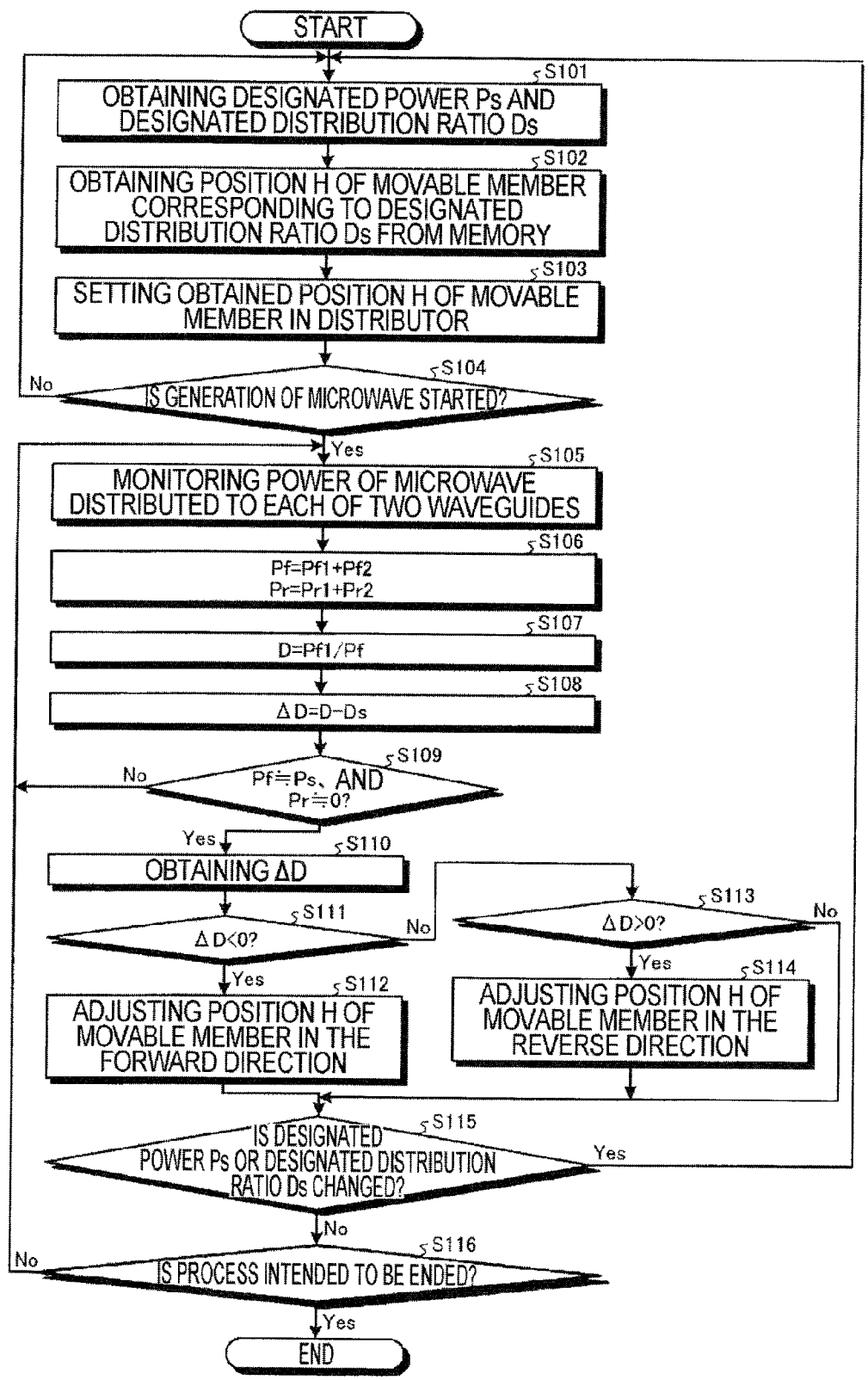
FIG. 20 is a flow chart illustrating an exemplary flow of a plasma supply method according to in the first embodiment.

Subsequently, descriptions will be made on a plasma supply method using the microwave plasma processing apparatus 10 illustrated in FIG. 1 with reference to FIG. 20. FIG. 20 is a flow chart illustrating an exemplary flow of a plasma supply method according to the first embodiment.

As illustrated in FIG. 20, the CPU 774 of the distribution ratio control circuit 770 obtains the designated power Ps and the designated distribution ratio Ds using, for example, the user interface (not illustrated) (step S101) and obtains the position H of the movable member corresponding to the designated distribution ratio Ds from the memory 773 (step S102). The CPU 774 sets the obtained position H of the movable member in the distributor 500 (step S103).

When it is determined that generation of the microwaves is not started by the microwave generator 400 ("NO" at step S104), the CPU 774 causes the process to go back to step S101 and waits.

In the meantime, when it is determined that generation of the microwaves is started by the microwave generator 400 ("YES" at step S104), the travelling wave monitor 710 and the travelling wave monitor 730 monitor the microwaves distributed to the waveguide 612 and the waveguide 613 from the distributor 500, respectively (step S105). That is, the travelling wave monitor 710 monitors the travelling wave power Pf1 and the travelling wave monitor 730 monitors the travelling wave power Pf2. In this case, the reflected wave monitor 720 monitors the reflected wave power Pr1 and the reflected wave monitor 740 monitors the reflected wave power Pr2.

The power operation circuit 750 calculates the total travelling wave power which is a total of the travelling wave power Pf1 and the travelling wave power Pf2 and the power operation circuit 760 calculates the total reflected wave power Pr which is a total of the reflected wave power Pr1 and the reflected wave power Pr2 (step S106).

The division circuit 771 of the distribution ratio control circuit 770 divides the travelling wave power Pf1 by the total travelling wave power Pf to calculate the effective distribution ratio (=Pf1/Pf) (step S107). The difference calculation circuit 772 subtracts the designated distribution ratio Ds from the effective distribution ratio D to calculate the difference $\Delta D$ (=D−Ds) between the effective distribution ratio D and the designated distribution ratio Ds (step S108).

The CPU 774 determines whether the plasma generated within the processing container 100 by the microwaves becomes stable (step S109). When it is determined that the plasma generated within the processing container 100 by the microwave does not become stable ("NO" at step S109), the CPU 774 causes the process to go back to step S105 and waits.

In the meantime, when it is determined that the plasma generated within the processing container 100 by the microwave becomes stable ("YES" at step S109), the CPU 774 obtains the difference $\Delta D$ (=D−Ds) between the effective distribution ratio D and the designated distribution ratio Ds from the difference calculation circuit 772 (step S110).

When it is determined that the difference $\Delta D$ (=D−Ds) is less than 0 (zero), in other words, when the effective distribution ratio D is smaller than the designated distribution ratio Ds ("YES" at step S111), the CPU 774 performs the following processing. That is, the CPU 774 adjusts the position H of the movable member along the forward direction to make the difference $\Delta D$ closer to 0 so as to correct the distribution ratio used for distributing the microwaves by the distributor 500 (step S112), and causes the process to proceed to step S115.

In the meantime, when it is determined that the difference $\Delta D$ (=D−Ds) is greater than 0 (zero), in other words, when the effective distribution ratio D is larger than the designated distribution ratio Ds ("NO" at step S111 and "YES" at step S113), the CPU 774 performs the following processing. That is, the CPU 774 adjusts the position H of the movable member along the reverse direction to make the difference $\Delta D$ closer to 0 (zero) so as to correct the distribution ratio used for the distribution of the microwaves by the distributor 500 (step S114), and causes the process to proceed to step S115.

In the meantime, when it is determined that the difference $\Delta D$ (=D−Ds) is not 0 (zero) ("NO" at step S111 and "NO" at step S113), the CPU 774 does not correct the distribution ratio used for the distribution of the microwaves by the distributor 500, and causes the process to proceed to step S115.

At step S115, the CPU 774 determines whether the designated power Ps or the designated distribution ratio Ds is changed. When it is determined that the designated power Ps or the designated distribution ratio Ds is changed ("YES" at step S115), the CPU 774 causes the process to go back to step S101. In the meantime, when it is determined that the designated power Ps or the designated distribution ratio Ds is not changed ("NO" at step S115), the CPU 774 causes the process to go back to step S116. In the meantime, when a difference between the changed designated distribution ratio determined at step S115 and the designated distribution ratio Ds is not large, the CPU 774 may cause the process to go back to step S116 as it is.

When finishing the process ("YES" at step S116), the CPU 774 finishes the plasma supply process. In the meantime, when not finishing the process ("NO" at step S116), the CPU 774 causes the process to go back to step S105.

As described above, the microwave plasma processing apparatus 10 according to the first embodiment monitors the powers of the microwaves distributed to the waveguide 612 and the waveguide 613 by the distributor 500 and corrects the distribution ratio used for the distribution of the microwaves by the distributor 500 based on the difference $\Delta D$ between a monitored ratio of the microwaves and a prescribed distribution ratio. Therefore, even when some of the microwaves are reflected toward the distributor 500 as the reflected waves, the microwave plasma processing apparatus 10 may dynamically cancel a deviation between the ratios of powers of the microwaves actually distributed to the waveguide 612 and the waveguide 613 and the prescribed distribution ratio. As a result, the microwave plasma processing apparatus 10 may improve an accuracy of the distribution of microwaves for a case where the microwaves distributed to each of the plurality of waveguides are radiated from the antenna.

Further, the microwave plasma processing apparatus 10 according to the first embodiment adjusts the position of the movable member within the distributor 500 to make the difference $\Delta D$ closer to 0 (zero) so as to correct the distribution ratio used for the distribution of the microwaves by the distributor 500. As a result, the microwave plasma processing apparatus 10 may improve an accuracy of the distribution of microwaves for a case where the microwaves distributed to each of the plurality of waveguides are radiated from the antenna.

Further, when the generation of the microwaves is started and the plasma becomes stable, the microwave plasma processing apparatus 10 according to the first embodiment corrects the distribution ratio used for the distribution of the microwaves by the distributor 500. Therefore, the microwave plasma processing apparatus 10 may correct the distribution ratio used for the distribution of the microwaves by the distributor 500 at an appropriate timing at which an influence by the reflected waves which may be easily generated before the plasma becomes stable is suppressed. As a result, the microwave plasma processing apparatus 10 may improve an accuracy of the distribution of microwaves for a case where the microwaves distributed to each of the plurality of waveguides are radiated from the antenna.

(Second Embodiment)

Figure 21:
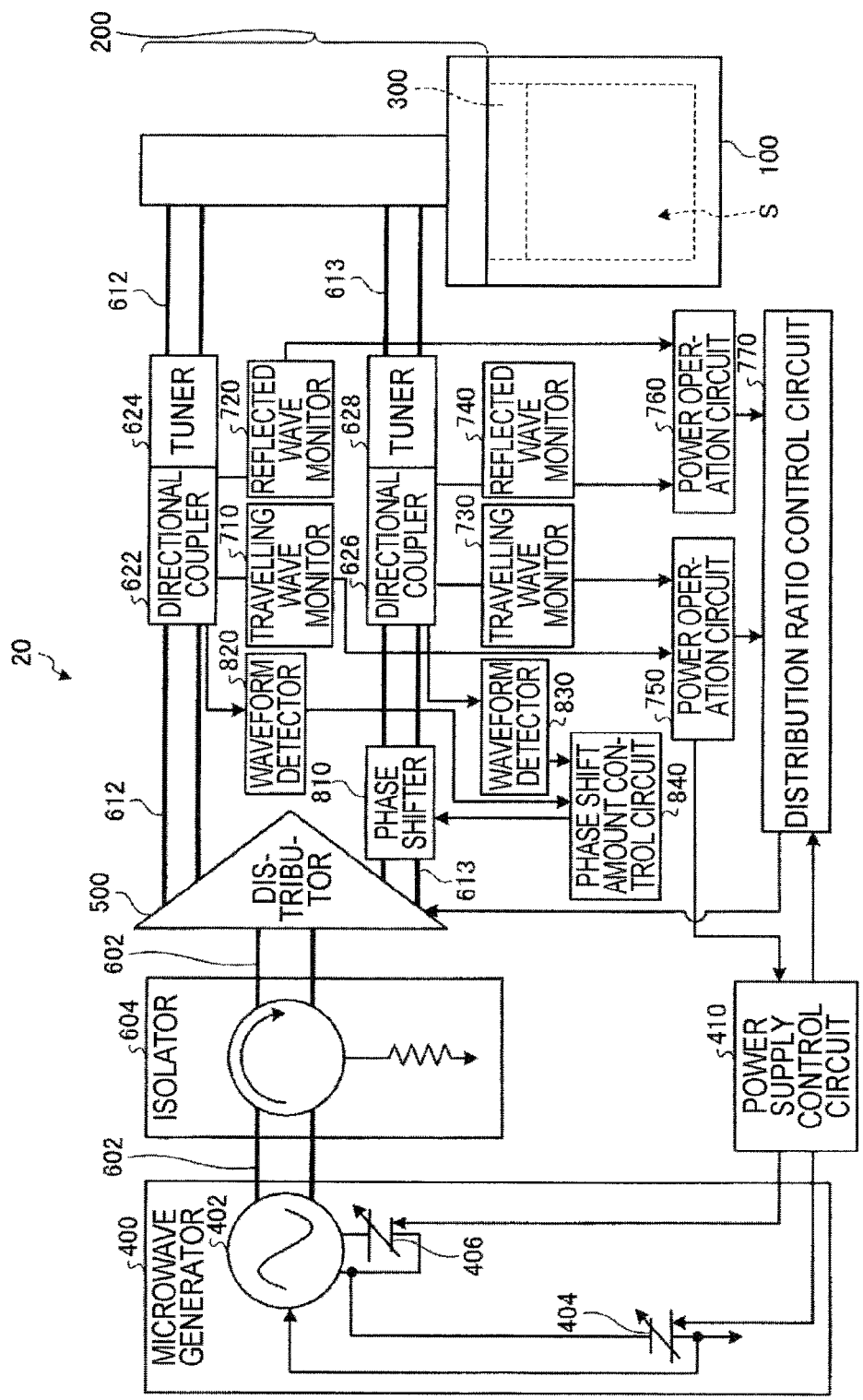
FIG. 21 is a block diagram illustrating an exemplary configuration of a microwave plasma processing apparatus according a second embodiment.

Subsequently, descriptions will be made on a microwave plasma processing apparatus according to a second embodiment. FIG. 21 is a block diagram illustrating an exemplary configuration of the microwave plasma processing apparatus according to the second embodiment. The microwave plasma processing apparatus according to the second embodiment is different from the microwave plasma processing apparatus according to the first embodiment in that a phase of the microwave propagating through the waveguide is shifted and other configuration of the microwave plasma processing apparatus according the second embodiment is the same as that of the microwave plasma processing apparatus according to the first embodiment. Accordingly, in the following, the same constitutional elements are assigned the same reference numerals and the descriptions thereof will be omitted.

As illustrated in FIG. 21, the microwave plasma processing apparatus 20 according to the second embodiment further includes a phase shifter 810, a waveform detector 820, a waveform detector 830, and a phase shift amount control circuit 840.

The phase shifter 810 is installed on one waveguide 613 of two waveguides 612 and 613 to shift the phase of the microwaves propagating through the waveguide 613. For example, the phase shifter 810 includes a waveguide provided with an input port and an output port, a circulator installed on the waveguide, and a movable member. The movable member is, for example, a stub or a movable short-circuiting plate. Also, the phase shifter 810 shifts the phase of the microwaves input to the input port from the waveguide 613 according to the position of the movable member. Further, the phase shift amount used for the phase shift of the microwave by the phase shifter 810 is variable. A control value for the phase shift amount of the phase shifter 810, that is, a position adjustment value of the movable member of the phase shifter 810 is input by the phase shift amount control circuit 840. That is, the phase shifter 810 uses the phase shift amount input by the phase shift amount control circuit 840 to shift the phase of the microwave propagating through the waveguide 613.

The waveform detector 820 detects the waveform of the microwaves distributed to the waveguide 612 by the distributor 500, that is, the travelling waves propagating inside of the waveguide 612 (hereinafter, the wave form may be referred to as a "Pf1 waveform") and outputs the detected Pf1 waveform to the phase shift amount control circuit 840. The waveform detector 830 detects the waveform of the microwaves distributed to the waveguide 613 by the distributor 500, that is, the travelling waves propagating inside of the waveguide 613 (hereinafter, the waveform may be referred to as a "Pf2 waveform") and outputs the detected Pf2 waveform to the phase shift amount control circuit 840. The waveform detector 820 and the waveform detector 830 are examples of the waveform detector.

The phase shift amount control circuit 840 controls the phase shift amount used for the phase shift of the microwave by the phase shifter 810.

Figure 22:
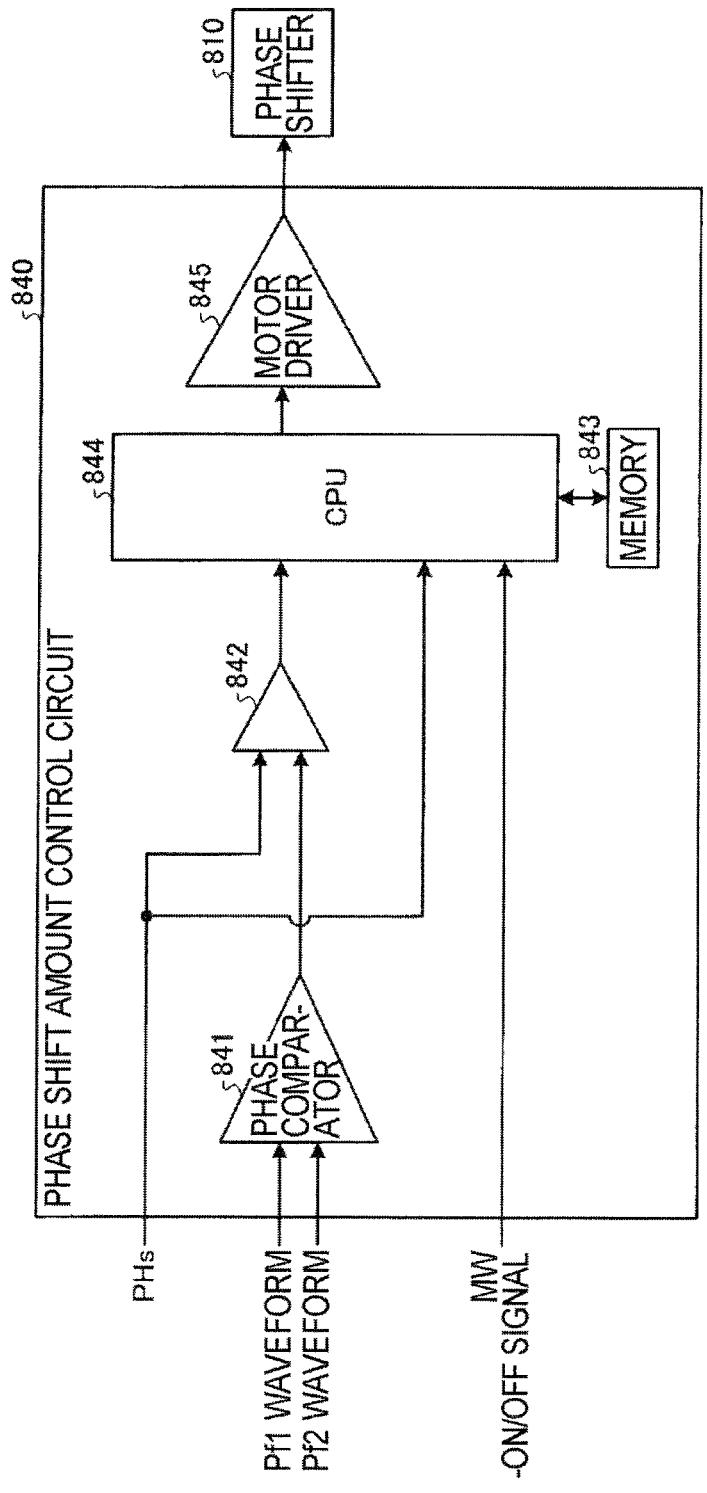
FIG. 22 is a view illustrating an exemplary configuration of a phase shift amount control circuit in the second embodiment.

Here, descriptions will be made on an exemplary configuration of the phase shift amount control circuit 840 with reference to FIG. 22. FIG. 22 is a view illustrating an exemplary configuration of the phase shift amount control circuit in the second embodiment. The phase shift amount control circuit 840 includes a phase comparator 841, a difference amplifier 842, a memory 843, a CPU 844, and a motor driver 845.

Figure 23:
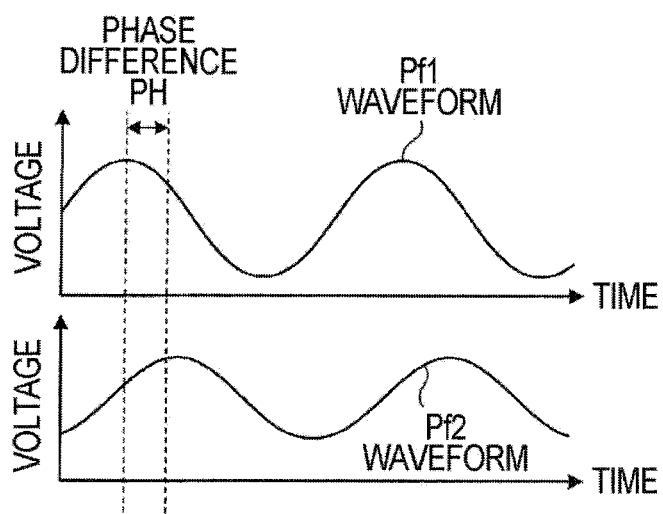
FIG. 23 is a graph illustrating an exemplary processing by a phase comparator in the second embodiment.

The phase comparator 841 receives the Pf1 waveform from the waveform detector 820 as an input. The phase comparator 841 receives the Pf2 waveform from the waveform detector 830 as an input. As illustrated in FIG. 23, the phase comparator 841 compares the Pf1 waveform with the Pf2 waveform to calculate a phase difference PH between the microwaves propagating inside of the waveguide 612 and the microwaves propagating inside of the waveguide 613. FIG. 23 is a graph illustrating an exemplary processing by the phase comparator in the second embodiment. The phase comparator 841 outputs the calculated phase difference PH to the difference amplifier 842.

The difference amplifier 842 receives the phase difference PH from the phase comparator 841 as an input. The difference amplifier 842 obtains the phase shift amount PHs of the phase shifter 810 designated a a user using, for example, a user interface (not illustrated). Hereinafter, the phase shift amount may also be referred to as a "designated phase shift amount". The difference amplifier 842 subtracts the designated phase shift amount PHs from the phase difference PH to calculate the difference ΔPH (=PH−PHs) between the phase difference PH and the designated phase shift amount PHs and outputs the calculated difference ΔPH to the CPU 844.

Figure 24:
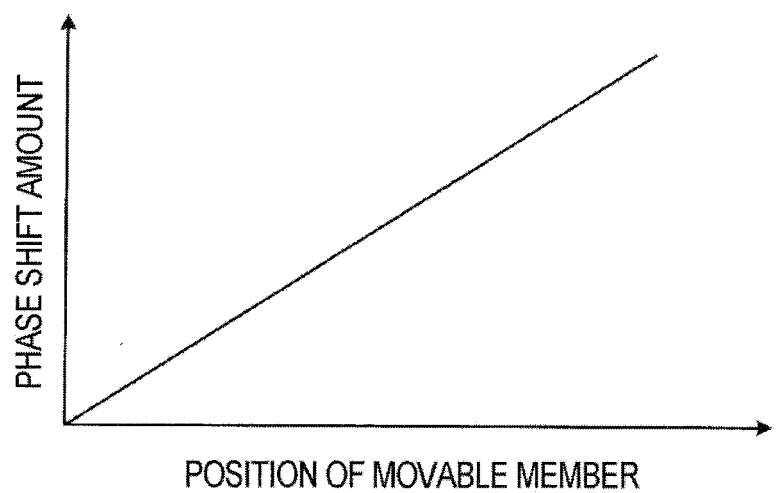
FIG. 24 is a graph illustrating an exemplary data structure of information stored in a memory in the second embodiment.

The memory 843 stores information used for a control of the phase shift amount by CPU 844. FIG. 24 is a graph illustrating an exemplary data structure of information stored in a memory in the second embodiment. As illustrated in FIG. 24, the memory 843 stores a correspondence relationship between the position of the movable member included in the phase shifter 810 and the phase shift amount of the phase shifter 810 according to the position of the movable member as the information used for the control of the phase shift amount by the CPU 844.

The CPU 844 corrects the phase shift amount used for the phase shift of the microwaves by the phase shifter 810 based on the difference ΔPH (=PH−PHs) between the phase difference PH and the designated phase shift amount PHs. Specifically, the CPU 844 adjusts the position of the movable member within the phase shifter 810 to make the difference ΔPH closer to 0 (zero) using the motor driver 845 to correct the phase shift amount used for the phase shift of the microwaves by the phase shifter 810. The CPU 844 is an example of the phase shift amount control unit.

The motor driver 845 drives a motor according to an instruction from the CPU 844 to move the position of the movable member within the phase shifter 810. In the meantime, the motor driver 845 may detect the position of the movable member within the phase shifter 810 by, for example, an encoder, and performs a feedback control for the position of the movable member within the phase shifter 810 by using the detected result.

Here, descriptions will be made on an exemplary phase shift amount control by the CPU 844 with reference to FIG.

Figure 25:
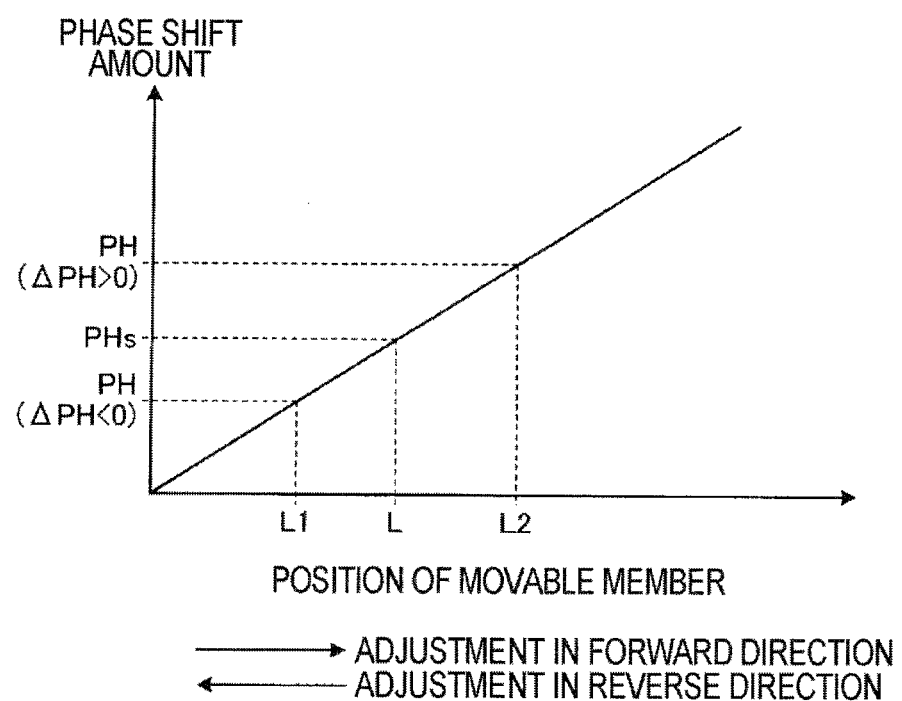
FIG. 25 is a graph illustrating an exemplary phase shift amount control by a CPU in the second embodiment.

25. FIG. 25 is a graph illustrating an exemplary phase shift amount control by a CPU in the second embodiment. FIG. 25 illustrates the correspondence relationship, which is stored in the memory 843, between the position of the movable member included in the phase shifter 810 and the phase shift amount for the phase shifter 810 according to the position of the movable member.

The CPU 844 obtains the designated phase shift amount PHs using, for example, the user interface (not illustrated) and, as illustrated in FIG. 25, obtains the position L of the movable member corresponding to the designated phase shift amount PHs from the memory 843. The CPU 844 sets the position L of the movable member obtained from the memory 843 in the phase shifter 810.

The CPU 844 obtains the difference ΔPH (=PH−PHs) between the phase difference PH and the designated phase shift amount PHs from the difference amplifier 842 and starts the correction of the phase shift amount using the difference ΔPH.

When the difference ΔPH (=PH−PHs) is less than 0 (zero), in other words, when the phase difference PH is smaller than the designated phase shift amount PHs, the CPU 844 performs the following processing. That is, as illustrated in FIG. 25, the CPU 844 adjusts the position L of the movable member along the forward direction to make the difference ΔPH closer to 0 (zero) so as to correct the phase shift amount used for the phase shift of the microwave by the phase shifter 810. Here, the forward direction is a direction away from the reference position 0 (zero). In the example of FIG. 25, it is assumed that the phase difference PH is smaller than the designated phase shift amount PHs. In this case, the position of the movable member corresponding to the phase difference PH is L1 and a difference between the position L of the movable member corresponding to the designated phase shift amount PHs and the position of the movable member corresponding to the phase difference PH is |L1−L|. Therefore, the CPU 844 adjusts the position L of the movable member along the forward direction by |L1−L| to make the difference ΔPH (=PH−PHs) closer to 0 (zero) so as to correct the phase shift amount used for the phase shift of the microwaves by the phase shifter 810.

In the meantime, when the difference ΔPH (=PH−PHs) is greater than 0 (zero), in other words, when the phase difference PH is larger than the designated phase shift amount PHs, the CPU 844 performs the following processing. That is, as illustrated in FIG. 25, the CPU 844 adjusts the position L of the movable member along the reverse direction to make the difference ΔPH closer to 0 (zero) so as to correct the phase shift amount used for the phase shift of the microwave by the phase shifter 810. Here, the reverse direction is a direction approaching the reference position 0 (zero). In the example of FIG. 25, it is assumed that the phase difference PH is larger than the designated phase shift amount PHs. In this case, the position of the movable member corresponding to the phase difference PH is L2 and a difference between the position L of the movable member corresponding to the designated phase shift amount PHs and the position of the movable member corresponding to the phase difference PH is |L2−L|. Therefore, the CPU 844 adjusts the position L of the movable member along the reverse direction by |L2−L| to make the difference ΔPH (=PH−PHs) closer to 0 (zero) so as to correct the phase shift amount used for the phase shift of the microwaves by the phase shifter 810.

In the meantime, when the difference ΔPH (=PH−PHs) is 0 (zero), in other words, when the designated phase shift amount PHs is equal to the phase difference PH, the CPU 844 does not correct the phase shift amount used for the phase shift of the microwave by the phase shifter 810.

Figure 26:
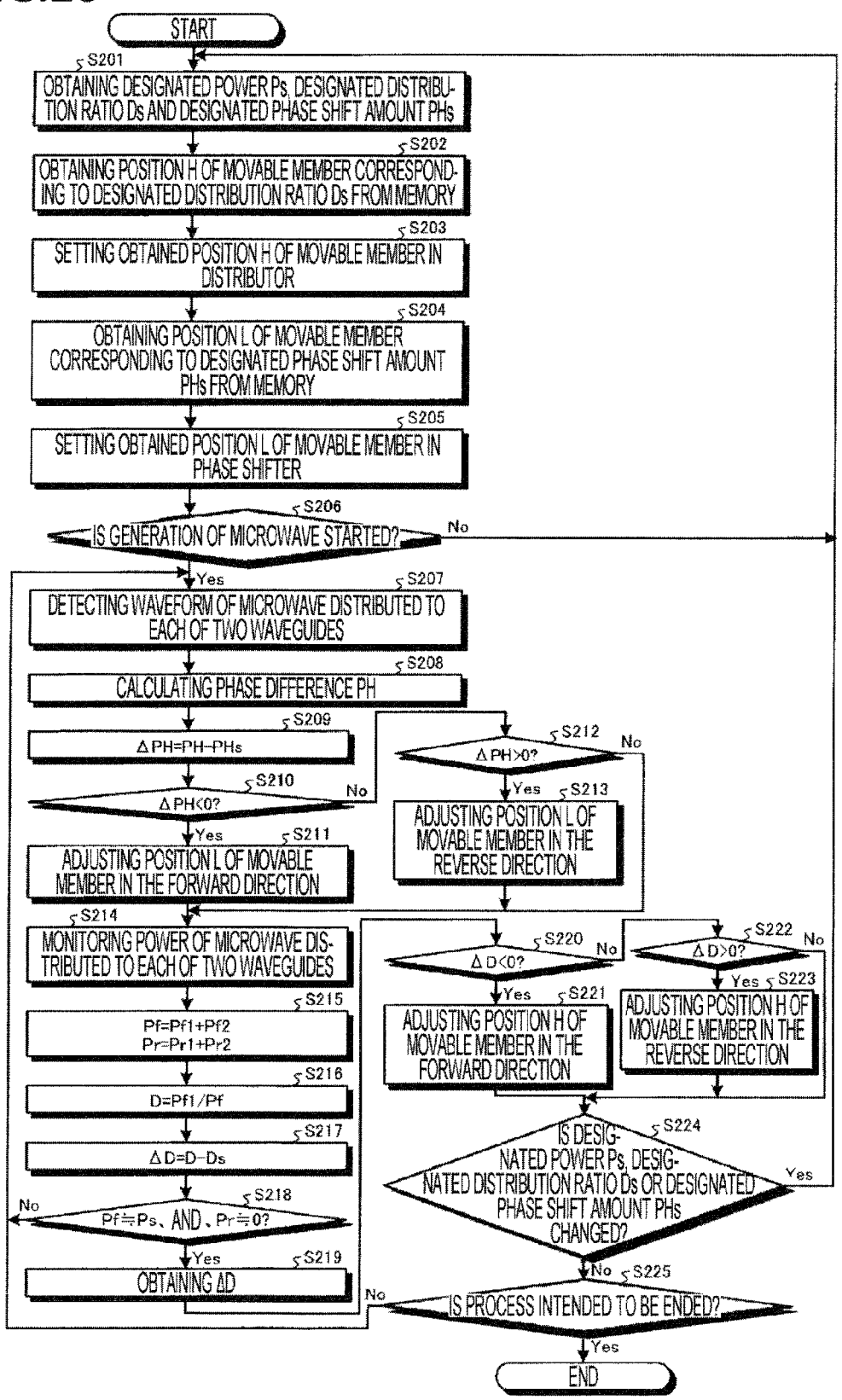
FIG. 26 is a flow chart illustrating an exemplary flow of a plasma supply method according to in the second embodiment.

Subsequently, descriptions will be made on the plasma supply method using the microwave plasma processing apparatus 20 illustrated in FIG. 21 with reference to FIG. 26. FIG. 26 is a flow chart illustrating an exemplary flow of a plasma supply method according to the second embodiment.

As illustrated in FIG. 26, the CPU 774 of the distribution ratio control circuit 770 obtains the designated power Ps and the designated distribution ratio Ds using, for example, the user interface (not illustrated) and the CPU 844 of the phase shift amount control circuit 840 obtains the designated phase shift amount PHs (step S201). The CPU 774 obtains the position H of the movable member corresponding to the designated distribution ratio Ds from the memory 773 (step S202). The CPU 774 sets the obtained position H of the movable member in the distributor 500 (step S203).

The CPU 844 obtains the position L of the movable member corresponding to the designated phase shift amount PHs from the memory 843 (step S204). The CPU 844 sets the obtained position L of the movable member in the phase shifter 810 (step S205).

When it is determined that generation of the microwaves is not started by the microwave generator 400 ("NO" at step S206), the CPU 774 causes the process to go back to step S201 and waits.

In the meantime, when it is determined that generation of the microwaves is started by the microwave generator 400 ("YES" at step S206), the waveform detector 820 and the waveform detector 830 detect the waveforms of the microwaves distributed from the distributor 500 to the waveguide 612 and the waveguide 613, respectively (step S207). That is, the waveform detector 820 detects the Pf1 waveform and the waveform detector 830 detects the Pf2 waveform.

The phase comparator 841 of the phase shift amount control circuit 840 compares the Pf1 waveform with the Pf2 waveform to calculate the phase difference PH between the travelling waves propagating inside of the waveguide 612 and the travelling waves propagating inside of the waveguide 613 (step S208). The difference amplifier 842 subtracts the designated phase shift amount PHs from the phase difference PH to calculate the difference ΔPH (=PH−PHs) between the phase difference PH and the designated phase shift amount PHs (step S209).

The CPU 844 of the phase shift amount control circuit 840 obtains the difference ΔPH (=PH−PHs) between the phase difference PH and the designated phase shift amount PHs from the difference amplifier 842. When the difference ΔPH (=PH−PHs) is less than 0 (zero), in other words, when the phase difference PH is smaller than the designated phase shift amount PHs ("YES" at step S210), the CPU 844 performs the following processing. That is, the CPU 844 adjusts the position L of the movable member along the forward direction to make the difference ΔPH closer to 0 so as to correct the phase shift amount used for the phase shift of microwaves by the phase shifter 810 (step S211), and causes the process to proceed to step S214.

When the difference ΔPH (=PH−PHs) is greater than 0 (zero), in other words, when the phase difference PH is larger than the designated phase shift amount PHs ("NO" at step S210 and "YES" at step S212), the CPU 844 performs the following processing. That is, the CPU 844 adjusts the position L of the movable member along the reverse direction to make the difference ΔPH closer to 0 so as to correct the phase shift amount used for the phase shift of microwaves by the phase shifter 810 (step S213), and causes the process to proceed to step S214.

In the meantime, when the difference ΔPH (=PH−PHs) is 0 (zero) ("NO" at step S210 and "NO" at step S212), the CPU 844 does not correct the phase shift amount used for the phase shift of microwaves by the phase shifter 810, and causes the process to proceed to step S214.

The travelling wave monitor 710 and the travelling wave monitor 730 monitor the powers of the microwaves distributed to the waveguide 612 and the waveguide 613 from the distributor 500, respectively (step S214). That is, the travelling wave monitor 710 monitors the travelling wave power Pf1 and the travelling wave monitor 730 monitors the travelling wave power Pf2. In this case, the reflected wave monitor 720 monitors the reflected wave power Pr1 and the reflected wave monitor 740 monitors the reflected wave power Pr2.

The power operation circuit 750 calculates the total travelling wave power Pf which is the total of the travelling wave power Pf1 and the travelling wave power Pf2, and the power operation circuit 760 calculates the total reflected wave power Pr which is the total of the reflected wave power Pr1 and the reflected wave power Pr2 (step S215).

The division circuit 771 of the distribution ratio control circuit 770 divides the travelling wave power Pf1 by the total travelling wave power Pf to calculate the effective distribution ratio (=Pf1/Pf) (step S216). The difference calculation circuit 772 subtracts the designated distribution ratio Ds from the effective distribution ratio D to calculate the difference ΔD (=D−Ds) between the effective distribution ratio D and the designated distribution ratio Ds (step S217).

The CPU 774 determines whether the plasma generated within the processing container 100 by the microwaves becomes stable (step S218). When it is determined that the plasma generated within the processing container 100 by the microwave does not become stable ("NO" at step S218), the CPU 774 causes the process to go back to step S207 and waits.

In the meantime, when it is determined that the plasma generated within the processing container 100 by the microwaves becomes stable ("YES" at step S218), the CPU 774 obtains the difference ΔD (=D−Ds) between the effective distribution ratio D and the designated distribution ratio Ds from the difference calculation circuit 772 (step S219).

When the difference ΔD (=D−Ds) is less than 0 (zero), in other words, when the effective distribution ratio D is smaller than the designated distribution ratio Ds ("YES" at step S220), the CPU 844 performs the following processing. That is, the CPU 774 adjusts the position H of the movable member along the forward direction to make the difference ΔD closer to 0 so as to correct the distribution ratio used for the distribution of microwave by the distributor 500 (step S221), and causes the process to proceed to step S224.

In the meantime, when the difference ΔD (=D−Ds) is greater than 0 (zero), in other words, when the effective distribution ratio D is larger than the designated distribution ratio Ds ("NO" at step S220 and "YES" at step S220), the CPU 774 performs the following processing. That is, the CPU 774 adjusts the position H of the movable member along the reverse direction to make the difference ΔD closer to 0 so as to correct the distribution ratio used for the distribution of microwave by the distributor 500 (step S223), and causes the process to proceed to step S224.

In the meantime, when the difference ΔD (=D−Ds) is 0 (zero) ("NO" at step S222), the CPU 774 does not correct the distribution ratio used for the distribution of microwaves by the distributor 500 and the process, and causes the process to proceed to step S224.

At step S224, the CPU 774 determines whether the designated power Ps or the designated distribution ratio Ds is changed and the CPU 844 determines whether the designated phase shift amount PHs is changed. When it is determined that the designated power Ps or the designated distribution ratio Ds is changed ("YES" at step S224), the process goes back to step S201 by the CPU 774 and when it is determined that the designated phase shift amount PHs is changed ("YES" at step S224), the process goes back to step S201 by the CPU 844. In the meantime, when it is determined that the designated power Ps or the designated distribution ratio Ds is not changed ("NO" at step S224), the CPU 774 causes the process to proceed to step S225 and when it is determined that the designated phase shift amount PHs is not changed ("NO" at step S224), the CPU 844 causes the process to proceed to step S225. In the meantime, when a difference between the changed designated distribution ratio determined at step S124 and the designated distribution ratio Ds and a difference between the changed designated phase shift amount and the designated phase shift amount PHs are not large, the CPU 844 may cause the process to proceed to step S225.

When finishing the process ("YES" at step S225), the CPU 774 finishes execution of the plasma supply processing. In the meantime, when not finishing the process ("NO" at step S225), the CPU 774 causes the process to go back to step S207.

As described above, the microwave plasma processing apparatus 20 according to the second embodiment calculates the phase difference PH between the microwave propagating through the waveguide 612 and the microwave propagating through the waveguide 613. Also, the microwave plasma processing apparatus 20 corrects the phase shift amount used for the phase shift of the microwaves by the phase shifter 810 based on the difference ΔPH between the calculated phase difference PH and the designated phase shift amount PHs. Therefore, the microwave plasma processing apparatus 20 is able to set the microwaves guided from the waveguide 612 to the dielectric window 300 through the inner waveguide within the slot antenna 200 and the microwaves guided from the waveguide 613 to the dielectric window 300 through the outer waveguide within the slot antenna 200 to have opposite phases. As a result, since interference between the microwaves within the dielectric window 300 may be avoided, the microwave plasma processing apparatus 20 is able to maintain a distribution uniformity of the plasma excited by the microwaves in the processing space S within the processing container 100.

(Third Embodiment)

Figure 27:
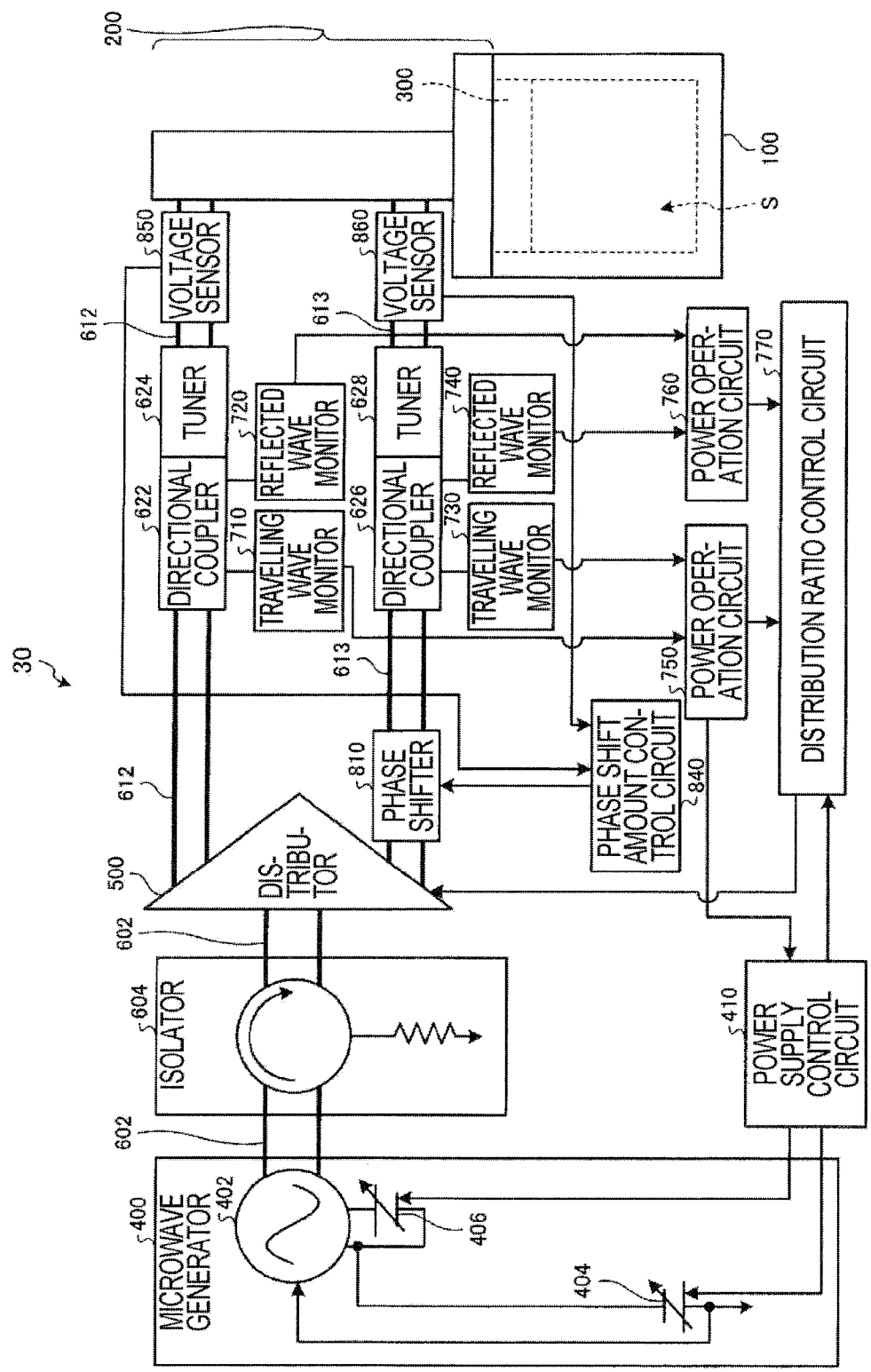
FIG. 27 is a block diagram illustrating an exemplary configuration of a microwave plasma processing apparatus according a third embodiment.

Subsequently, descriptions will be made on the microwave plasma processing apparatus according to the third embodiment. FIG. 27 is a block diagram illustrating an exemplary configuration of a microwave plasma processing apparatus according to a third embodiment. The configuration of the microwave plasma processing apparatus according to the third embodiment is the same as that of the second embodiment, except that a method for calculating the phase difference PH between the microwave propagating through the waveguide 612 and the microwave propagating through the waveguide is different from that in the microwave plasma processing apparatus according to the second exemplary embodiment. Accordingly, in the following, the same constitutional elements as those of the second embodiment are assigned the same reference numerals and the descriptions thereof will be omitted.

As illustrated in FIG. 27, the microwave plasma processing apparatus 30 according to the third embodiment newly includes a voltage sensor 850 and a voltage sensor 860, instead of the waveform detector 820 and the waveform detector 830 illustrated in FIG. 21.

The voltage sensor 850 is installed at a position closer to the slot antenna 200 than the position of the tuner 624 in the waveguide 612. The voltage sensor 850 detects a voltage V1 of microwaves distributed to the waveguide 612 by the distributor 500, that is, travelling waves propagating inside of the waveguide 612. The voltage V1 may include, for example, Vpp which has a peak-to-peak value of voltage or Vdc which has an intermediate value of voltage. The Vpp indicates a magnitude of a standing wave generated within the waveguide and the Vdc indicates an offset amount of the standing wave generated within the waveguide. The voltage sensor 850 outputs the detected voltage V1 to the phase shift amount control circuit 840.

The voltage sensor 860 is installed at a position closer to the slot antenna 200 than the position of the tuner 628 in the waveguide 613. The voltage sensor 860 detects a voltage V2 of the microwaves distributed to the waveguide 613 by the distributor 500, that is, the travelling waves propagating inside of the waveguide 613. The voltage V2 may include, for example, Vpp which has a peak-to-peak value of voltage or Vdc which has an intermediate value of voltage. The voltage sensor 860 outputs the detected voltage V2 to the phase shift amount control circuit 840. The voltage sensor 850 and the voltage sensor 860 are examples of the voltage detection unit.

The phase comparator 841 of the phase shift amount control circuit 840 receives the voltage V1 from the voltage sensor 850 as an input. The phase comparator 841 receives the voltage V2 from the voltage sensor 860 as an input. The phase comparator 841 compares the voltage V1 with the voltage V2 to calculate the phase difference PH between the travelling waves propagating inside of the waveguide 612 and the travelling waves propagating inside of the waveguide 613. The phase comparator 841 outputs the calculated phase difference PH to the difference amplifier 842.

As described above, the microwave plasma processing apparatus 30 according to the third embodiment may calculate the phase difference PH between the travelling waves propagating inside of the waveguide 612 and the travelling waves propagating inside of the waveguide 613 using the voltage V1 of the travelling waves propagating inside of the waveguide 612 and the voltage V2 of the travelling waves propagating inside of the waveguide 613.

MODIFIED EXAMPLE 1

Subsequently, descriptions will be made on Modified Example 1 of the microwave plasma processing apparatus according to the first to the third embodiments. In the following, descriptions will be made on Modified Example 1 of the microwave plasma apparatus of according to the second embodiment in representative of the microwave plasma processing apparatus according to Modified Example 1.

Figure 28:
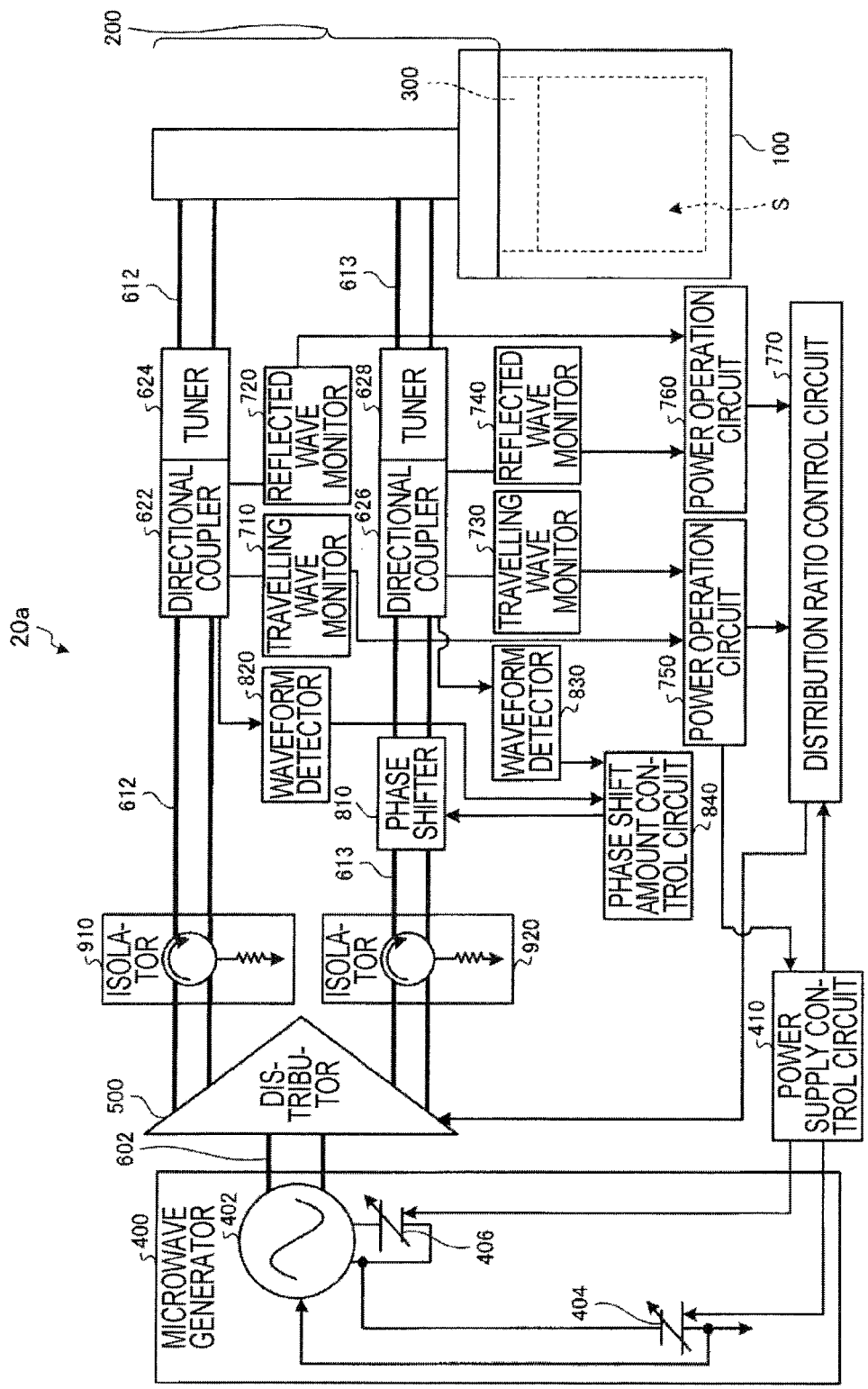
FIG. 28 is a view illustrating an exemplary configuration of Modified Example 1 of the microwave plasma processing apparatus according to the second embodiment.

FIG. 28 is a view illustrating an exemplary configuration of Modified Example 1 of the microwave plasma processing apparatus according to the second embodiment. The microwave plasma processing apparatus according to Modified Example 1 is different from the microwave plasma processing apparatus according to the second embodiment in that an isolator is installed at a rear end side of the distributor 500a, and other constitutional elements of the microwave plasma processing apparatus according to Modified Example 1 are the same as those of the microwave plasma processing apparatus according to the second embodiment. Accordingly, in the following, the same constitutional elements as those of the second embodiment are assigned the same reference numerals and the descriptions thereof will be omitted.

As illustrated in FIG. 28, the microwave plasma processing apparatus 20a according to Modified Example 1 newly includes an isolator 910 installed on the waveguide 612 and an isolator 920 installed on the waveguide 613. Further, the microwave plasma processing apparatus 20a according to Modified Example 1 does not include the isolator 604 illustrated in FIG. 21.

The isolator 910 blocks the reflected waves obtained when some of the microwaves distributed to the waveguide 612 by the distributor 500 are reflected toward the distributor 500 from the slot antenna 200 side. Specifically, the isolator 910 separates the reflected waves of the microwaves from the slot antenna 200 side by a circulator and converts the separated reflected waves into heat by a dummy load.

The isolator 920 blocks the reflected waves obtained when some of the microwaves distributed to the waveguide 613 by the distributor 500 are reflected toward the distributor 500 from the slot antenna 200 side. Specifically, the isolator 920 separates the reflected waves of the microwave from the slot antenna 200 side by a circulator and converts the separated reflected waves into heat by a dummy load.

As described above, in the microwave plasma processing apparatus 20a according to Modified Example 1, the isolators 910 and 920 are installed on the waveguides 612 and 613, respectively, and the reflected waves obtained by being reflected from the slot antenna 200 side toward the distributor 500 are blocked using the isolators 910 and 920. As a result, since the microwave plasma processing apparatus 20a is able to prevent the reflected waves generated following the starting of the microwave generation from infiltrating into the distributor 500, the accuracy of the distribution of microwaves may be further improved.

MODIFIED EXAMPLE 2

Subsequently, descriptions will be made on Modified Example 2 of the microwave plasma processing apparatus according to the first to the third embodiments. In the following, descriptions will be made on Modified Example 2 of the microwave plasma apparatus of according to the second embodiment in representative of the microwave plasma processing apparatus according to the Modified Example 2.

Figure 29:
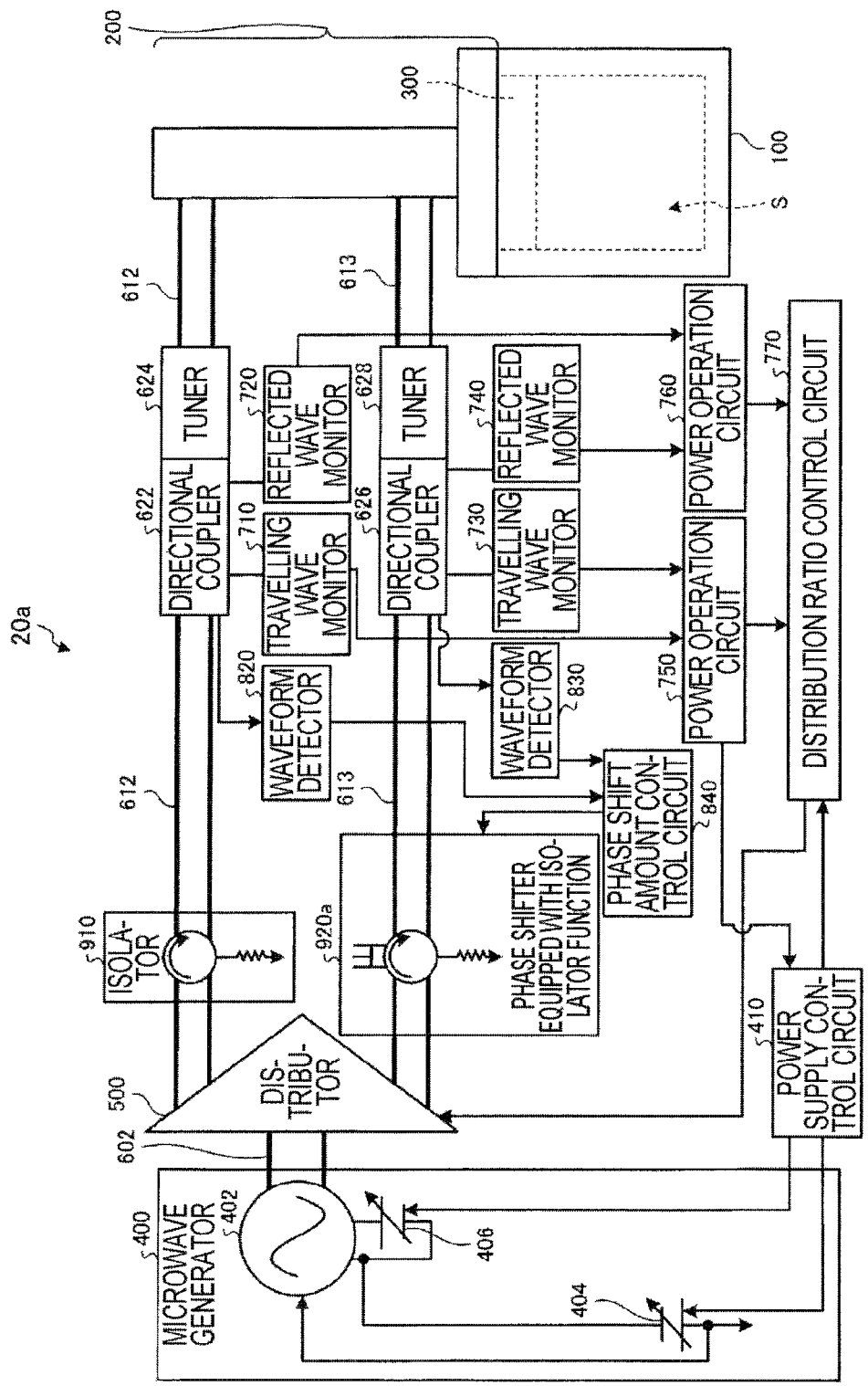
FIG. 29 is a view illustrating an exemplary configuration of Modified Example 2 of the microwave plasma processing apparatus according to the second embodiment.

FIG. 29 is a view illustrating an exemplary configuration of Modified Example 2 of the microwave plasma processing apparatus according to the second embodiment. The microwave plasma processing apparatus according to Modified Example 2 is different from the microwave plasma processing apparatus according to Modified Example 1 in that a phase shifter equipped with a function of an isolator is installed at a rear end side of the distributor 500a, and other constitutional elements of the microwave plasma processing apparatus according to Modified Example 2 are the same as those of the microwave plasma processing apparatus according to Modified Example 1. Accordingly, in the following, the same constitutional elements as those of Modified Example 1 are assigned the same reference numerals and the descriptions thereof will be omitted.

As illustrated in FIG. 29, the microwave plasma processing apparatus 20b according to Modified Example 2 includes a phase shifter 920a equipped with a function of the isolator, instead of the isolator 920 and the phase shifter 810 illustrated in FIG. 28.

The phase shifter 920a equipped with the function of the isolator blocks the reflected waves obtained when some of the microwaves distributed to the waveguide 613 by the distributor 500 are reflected toward the distributor 500 from the slot antenna 200 side, similar to the isolator 920 illustrated in FIG. 28.

Further, the phase shifter 920a equipped with a function of the isolator shifts the phase of the microwave propagating inside of the waveguide 613, similar to the phase shifter 810 illustrated in FIG. 28. For example, the phase shifter 920a equipped with the function of the isolator includes a waveguide including an input port and an output port, a circulator installed on the waveguide and a movable member. The movable member is, for example, a stub or a movable short-circuiting plate. Also, the phase shifter 920a equipped with the function of the isolator shifts the phase of the microwave input to the input port from the waveguide 613 depending on the position of the movable member. Further, the phase shift amount used for the phase shift of the microwaves by the phase shifter 920a equipped with the function of the isolator is variable. A control value for the phase shift amount of the phase shifter 920a equipped with the function of the isolator, that is, a position adjustment value of the movable member of the phase shifter 920a equipped with the function of the isolator is input by the phase shift amount control circuit 840. That is, the phase shifter 920a equipped with the function of the isolator uses the phase shift amount input by the phase shift amount control circuit 840 to shift the phase of the microwaves propagating through the waveguide 613.

In the microwave plasma processing apparatus 20b according to Modified Example 2, the isolator 910 and the phase shifter 920a equipped with the function of the isolator are installed on the waveguides 612 and 613, respectively, and the reflected waves obtained by being reflected from the slot antenna 200 side toward the distributor 500 are blocked using the isolator 910 and the phase shifter 920a equipped with the function of the isolator 920. As a result, since the reflected waves generated following the starting of the microwave generation may be prevent from infiltrating into the distributor 500, the microwave plasma processing apparatus 20b is able to further improve the accuracy of distribution of microwaves. Further, in the microwave plasma processing apparatus 20b, since the isolator function and the function of shifting the phase of the microwaves propagating inside of the waveguide 613 are combined to be used by a single phase shifter 920a equipped with the isolator function, an increase of the number of components may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A microwave plasma processing apparatus comprising:
   a processing container configured to define a processing space;
   a microwave generator configured to generate microwaves for generating plasma of a processing gas introduced into the processing space;
   a distributor configured to distribute the microwaves to a plurality of waveguides using a variable distribution ratio;
   an antenna installed in the processing container to seal the processing space and configured to radiate the microwaves distributed to each of the plurality of waveguides by the distributor to the processing space;
   a monitor unit configured to monitor a power of the microwaves distributed to each of the plurality of waveguides by the distributor; and
   a distribution ratio control unit configured to correct the distribution ratio used for distribution of the microwaves by the distributor based on a difference between a ratio of the power of the microwaves monitored by the monitor unit and a previously designated distribution ratio,
   wherein the distributor includes a movable member and distributes the microwaves to the plurality of waveguides according to a position of the movable member, and
   the distribution ratio control unit adjusts the position of the movable member to make the difference closer to 0 (zero) so as to correct the distribution ratio used for distribution of the microwaves by the distributor.

2. The microwave plasma processing apparatus of claim 1, wherein the distribution ratio control unit corrects the distribution ratio used for the distribution of microwaves by the distributor when generation of the microwaves is started by the microwave generator.

3. The microwave plasma processing apparatus of claim 1, wherein the distribution ratio control unit corrects the distribution ratio used for the distribution of microwaves by the distributor when generation of the microwaves is started by the microwave generator and the plasma generated by the microwaves also become stable.

4. The microwave plasma processing apparatus of claim 1, further comprising:
   a phase shifter installed on at least one of the plurality of waveguides and configured to shift a phase of microwaves which propagate through at least one of the waveguides using a variable phase shift amount;
   a waveform detector configured to detect a waveform of the microwaves distributed to each of the plurality of waveguides by the distributor; and
   a phase shift amount control unit configured to calculate a phase difference between the microwaves which propagate through at least one waveguide and the microwave which propagates through a waveguide which is different from the at least one waveguide using a detected result by the waveform detector, and correct the phase shift amount used for the phase shift of the microwaves by the phase shifter based on a difference between the calculated phase difference and the previously designated phase shift amount.

5. The microwave plasma processing apparatus of claim 1, further comprising:
   a phase shifter installed on at least one of the plurality of waveguides and configured to shift a phase of the microwaves which propagates through at least one of the waveguides using a variable phase shift amount;
   a voltage detector configured to detect a voltage of the microwaves distributed to each of the plurality of waveguides by the distributor; and
   a phase shift amount control unit configured to calculate a phase difference between the microwave which propagates through at least one waveguide and the microwaves which propagate through a waveguide which is different from the at least one waveguide using a detected result by the voltage detector and correct the phase shift amount used for the phase shift of the microwaves by the phase shifter based on a difference between the calculated phase difference and the previously designated phase shift amount.

6. The microwave plasma processing apparatus of claim 1, further comprising an isolator installed on each of the plurality of waveguides and configured to isolate the reflected waves obtained when some of the microwaves are distributed to each of the plurality of waveguides by the distributor are reflected from the antenna side towards the distributor.

7. A microwave supply method using a microwave plasma processing apparatus which includes: a processing container configured to define a processing space, a microwave generator configured to generate microwaves for generating plasma of a processing gas introduced into the processing space, a distributor configured to distribute the microwave to a plurality of waveguides using a variable distribution ratio, an antenna installed in the processing container to seal the processing space and configured to radiate the microwave distributed by the distributor to each of the plurality of waveguides to the processing space, a monitor unit, and a distribution ratio control unit, the microwave supply method comprising:

monitoring, by the monitor unit, a power of the microwaves distributed to each of the plurality of waveguides by the distributor; and correcting, by the distribution ratio control unit, the distribution ratio used for the distribution of microwaves by the distributor based on a difference between a ratio of the power of the monitored microwaves and a previously designated power ratio, wherein the distributor includes a movable member and distributes the microwaves to the plurality of waveguides according to a position of the movable member, and the distribution ratio control unit adjusts the position of the movable member to make the difference closer to 0 (zero) so as to correct the distribution ratio used for distribution of the microwaves by the distributor.

* * * * *